United States Patent [19]
Maeda et al.

[11] Patent Number: 5,981,990
[45] Date of Patent: Nov. 9, 1999

[54] SEMICONDUCTOR MEMORY DEVICE, METHOD OF MANUFACTURING THE SAME AND METHOD OF USING THE SAME

[75] Inventors: Shigenobu Maeda; Shigeto Maegawa; Hirotada Kuriyama, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/607,046

[22] Filed: Feb. 26, 1996

[30] Foreign Application Priority Data

Jul. 11, 1995  [JP]  Japan .................... 7-174774

[51] Int. Cl.$^6$ .................................. H01L 27/108
[52] U.S. Cl. ...................... 257/299; 257/58; 257/67; 257/903
[58] Field of Search .................. 257/58, 66, 67, 257/299, 903

[56] References Cited

U.S. PATENT DOCUMENTS 5,281,843  1/1994  Ochii et al. .................... 257/393
5,557,231  9/1996  Yamaguchi et al. .................... 327/534

FOREIGN PATENT DOCUMENTS

| 4-356966 | of 0000 | Japan . |
| 4-61160 | of 0000 | Japan . |
| 5-335521 | of 0000 | Japan . |
| 6-85209 | of 0000 | Japan . |
| 4-61160 | 2/1992 | Japan . |
| 5-283651 | 10/1993 | Japan . |

*Primary Examiner*—Sara Crane
*Attorney, Agent, or Firm*—McDermott, Will & Emery

[57] ABSTRACT

In a memory cell of an SRAM, a load transistor has a pair of source/drain regions formed to define a channel region, and a gate electrode layer being opposite to the channel region with an insulating layer therebetween. A VVP layer is formed to sandwich the channel region with the gate electrode layer to be opposite to channel region with an insulating layer therebetween. This VVP layer is provided such that GND potential is applied when active and Vcc potential is applied during standby. Thus, a large ON current can be implemented while maintaining a small OFF current of a TFT, even when the power supply voltage is made lower due to reduction in voltage.

18 Claims, 42 Drawing Sheets

A—A CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

A—A CROSS SECTION

B—B CROSS SECTION

SEMICONDUCTOR MEMORY DEVICE, METHOD OF MANUFACTURING THE SAME AND METHOD OF USING THE SAME

BACKGROUND OF THE INVENTION

1. Field of the Invention

The present invention relates to a semiconductor memory device, a method of manufacturing the same and a method of using the same. More particularly, the present invention relates to a semiconductor memory device including a memory device which can be written/read at any time (i.e., an SRAM: Static Random Access Memory), a method of manufacturing the same and a method of using the same.

2. Description of the Background Art

Conventionally, an SRAM is known as one type of semiconductor memory device. When compared to a DRAM (Dynamic Random Access Memory), this SRAM has an advantage that it does not require a refresh operation and its state of storage is stable.

FIG. 42 is an equivalent circuit diagram of one memory cell in a conventional SRAM. Referring to FIG. 42, this memory cell employs a p type MOS (Metal Oxide Semiconductor) transistor as the load and is formed of six transistors. More specifically, it is formed of a pair of access transistors Q3, Q4 (which are n type MOS transistors), a pair of driver transistors Q1, Q2 (which are n type MOS transistors) and a pair of load transistors Q5, Q6 forming a flip flop circuit.

Each of the paired load transistors Q5 and Q6 has its one source/drain region connected to a Vcc power supply, and their other source/drain regions are connected to storage nodes N1 and N2, respectively. Each of driver transistors Q1 and Q2 has its one source/drain region connected to GND, and their other source/drain regions are connected to storage nodes N1 and N2, respectively. Driver transistor Q1 and load transistor Q5 have each of their gates connected to storage node N2, and driver transistor Q2 and load transistor Q6 have each of their gates connected to storage node N1, respectively.

In addition, a pair of access transistors Q3 and Q4 each have one of their source/drain regions connected to storage nodes N1 and N2, respectively. The other source/drain regions of access transistors Q3 and Q4 are each connected to bit lines BL and /BL, respectively. Also, the gate electrodes of access transistors Q3 and Q4 are in connection with a word line WL.

In the memory cell of this SRAM, thin film transistors (TFT) are generally employed as the pair of load transistors Q5 and Q6.

FIGS. 43 and 44 are schematic cross sectional views showing load transistors formed of thin film transistors of bottom gate and top gate types. Referring to FIG. 43, load transistor Q5 (or Q6) has a gate electrode layer 301, and a pair of source/drain regions 303a, 303c formed at a semiconductor layer to define a channel region 303b. Gate electrode layer 301 is formed to be opposite to this channel region 303b with a gate insulating film therebetween. This load transistor Q5 (or Q6) is a so-called bottom gate type thin film transistor, and thus gate electrode 301 is arranged below channel region 303b.

Referring to FIG. 44, this load transistor Q5 (or Q6) is a so-called top gate type thin film transistor, and thus a gate electrode layer 301 is arranged above a channel region 303b.

In the structures of the conventional thin film transistors shown in FIGS. 43 and 44, there has been a problem that the stability of the operation of the memory cell is degraded when reduction in the voltage has caused decrease the power supply voltage. The following is a detailed description of this problem.

FIG. 45 is a graph showing a characteristics of a typical p channel TFT concerning drain current $I_D$ and gate voltage $V_G$. Referring to FIG. 45, there are two points required for this TFT characteristic, that is, (1) to reduce the current which flows when TFT is turned OFF (i.e., OFF current), and (2) to increase the current which flows when TFT is turned ON (i.e., ON current).

The above (1) is required so as to reduce the power consumption during standby, since the power consumed during standby is determined by OFF current×the number of cells in one TFT.

The above (2) is required so as to improve the stability of the operation of the memory cell, since when ON current is increased, the potential of the storage node connected to one source/drain region of the TFT which is turned ON becomes more closer to Vcc and the difference between the High potential of that storage node and the Low potential of the other storage node is made distinct.

To what extent the ON current of the TFT is required will be described in the following, although it is certain that the stability of operation of the memory cell is increased in proportion to the amount of ON current.

FIG. 46 is a diagram of a portion of the circuit of the SRAM, in which the voltage at the portion of the storage node storing High immediately after reading or writing is shown. Referring to FIG. 46, the potential at storage node N1 immediately after reading/writing is High, but it has not fully reached Vcc and is expressed as Vcc−$Vth_A$. Here, Vcc is the power supply voltage, and $Vth_A$ is the threshold voltage of an access transistor. Owing to the amount of decrease in the potential of storage node N1 due to $Vth_A$, the operation of the memory cell immediately after reading/writing is unstable. TFT Q5 serves to charge storage node N1 to make up for this amount of decrease due to $Vth_A$.

Here, when $Vth_A$ is 1 V and the capacitance of storage node N1 is 5 fF, the ON current of TFT required to charge this storage node N1 within a time period of 5 nsec would be expressed as follows.

$$\frac{5 \text{ fF} \times 1 \text{ V}}{5 \text{ nsec}} = 1 \mu A$$

Since the channel region is of a polycrystalline silicon in a TFT, the S-factor in the $I_D$-$V_G$ characteristic shown in FIG. 45 is increased (that is, the gradient is made small). Here, S-factor represents a gate voltage $V_G$ required for $I_D$ to increase by one order of magnitude.

Accordingly, with reference to FIG. 45, when power supply voltage is reduced from −Vcc to −Vcc' owing to reduction of the voltage, this ON current of TFT is also reduced from $I_{D1}$ to $I_{D2}$. Thus, in the structure of TFT employed in the conventional SRAM, it was difficult to implement a large ON current while maintaining a small OFF current.

Moreover, since the channel region is of polycrystalline silicon, the characteristic of TFT is varied depending on whether there is a grain boundary in this channel region or not. Limitation on the above-described ON current (the value-required being 1 μA) must hold even when there is a variation in the characteristic of TFT. Accordingly, when this variation in the characteristics of TFT is taken into consideration, it was still more difficult to implement a large ON current while maintaining a small OFF current.

SUMMARY OF THE INVENTION

An object of the present invention is to implement a large ON current while maintaining a small OFF current in a TFT even when power supply voltage is made lower owing to reduction in voltage.

The semiconductor memory device according to the present invention as well as methods of manufacturing and using the same are assumed to be a semiconductor memory device including a static type memory cell having a pair of transistors for driving of a first conductivity type together with a pair of load transistors of a second conductivity type forming a flip flop circuit and a pair of access transistors, as well as methods of manufacturing and using the same, having the features as described in the following.

In the semiconductor memory device of the present invention, the load transistor is formed of a thin film transistor, having a semiconductor layer and gate electrode layer. The semiconductor layer has a pair of source/drain regions formed to define a channel region and spaced apart from each other by a prescribed distance. The gate electrode layer is provided to be opposite to the channel region of the semiconductor layer with a gate insulating layer therebetween. A conductive layer is provided to sandwich the channel region with this gate electrode layer while being opposite to the channel region with the insulating layer therebetween so as to be at Vcc potential during standby and GND potential when it is active.

In the semiconductor memory device according to the present invention, the conductive layer is opposite to the rear side of the channel region with the insulating layer therebetween. In addition, the conductive layer is at GND potential when at an active state. Accordingly, for p channel TFT, it is like having a minus potential from the rear side of the channel region. Thus, the potential of the rear side of the channel region is made lower such that a hole is likely to be generated, and the threshold voltage Vth of the TFT is decreased. As a result, it is possible to improve the ON current of the TFT when at an active state.

Meanwhile, the conductive layer is at Vcc potential during standby. Accordingly, for the p channel TFT, the voltage applied to the rear side of the channel region is 0 V. Thus, the TFT during standby shows a characteristic in which OFF current is made smaller when the gate voltage is 0 V.

As can be seen from the foregoing, it is possible to implement a large ON current while maintaining a small OFF current in the TFT even when the power supply voltage is made lower due to the reduction in the voltage.

In a semiconductor memory device according to one preferred aspect of the present invention, the film thickness of the insulating layer is not less than 39 nm and not more than 323 nm.

In the semiconductor memory device according to one preferred aspect of the present invention, source/drain region and the channel region are of a p type conductivity. In addition, the film thickness of insulating layer is not less than 66 nm and not more than 323 nm.

In a semiconductor memory device according to one preferred aspect of the present invention, source/drain region is of a p type conductivity and the channel region is of an n type conductivity. A thin film transistor is formed such that the depth to which a depletion layer extends from a surface opposite to a gate electrode layer of a channel region exceeds the film thickness of the channel region when the thin film transistor is turned ON. The film thickness of insulating layer is not less than 39 nm and not more than 123 nm.

In a semiconductor memory device according to one preferred aspect of the present invention, a source/drain region is of a p type conductivity and a channel region is of an n type conductivity. A thin film transistor is formed such that depth to which a depletion layer extends from a surface opposite to a gate electrode layer of a channel region is smaller than the film thickness of the i1 channel region when the thin film transistor is turned ON. The thickness of the insulating layer is not less than 46 nm and not more than 153 nm.

In the semiconductor memory device according to the above four preferred aspects of the present invention, the range of the film thickness of the insulating layer is defined according to TFTs of various types. When the film thickness of the insulating layer is made smaller than the lower limit of this range of film thickness, OFF current of the TFT in active state is significantly increased, and power consumption is increased. Meanwhile, when the thickness of the insulating layer is made larger than the upper limit of the range of film thickness, ON current at active state is significantly reduced, and a stable operation of the TFT cannot be obtained.

A method of manufacturing the semiconductor memory device according to the present invention includes the following steps.

A semiconductor layer having a pair of source/drain regions formed with a prescribed distance between each other to define a channel region and a gate electrode layer opposite to the channel region of the semiconductor layer with a gate insulating layer therebetween are formed so as to form a load transistor consisting of a thin film transistor. Then, a conductive layer is formed to sandwich the channel region with the gate electrode layer while being opposite to the channel region with the insulating layer therebetween to be at a Vcc potential during standby and GND potential when at an active state.

In a manufacturing method of the semiconductor memory device according to the present invention, a semiconductor memory device can be manufactured in which a large ON current can be implemented while maintaining a small OFF current in a TFT even when the power supply voltage is made lower owing to reduction in voltage.

In the method of using a semiconductor memory device according to the present invention, a load transistor consists of a thin film transistor, having a semiconductor layer and a gate electrode layer. A semiconductor layer has a pair of source/drain regions formed with a prescribed distance between each other to define a channel region. A gate electrode layer is provided opposite to the channel region of the semiconductor layer with a gate insulating layer therebetween. A conductive layer is provided to sandwich the channel region with gate electrode layer while being opposite to the channel region with the insulating layer therebetween. To this conductive layer, a Vcc potential is applied during the standby and GND potential is applied when at an active state.

In the method of using a semiconductor memory device according to the present invention, a semiconductor memory device can be operated such that a large ON current can be implemented while maintaining a small OFF current in the TFT even when power supply voltage is made lower owing to reduction in voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description of the embodiment of the embodiments according to the present invention will be described in the following, with reference to the figures.

Embodiment 1

Figure 1:
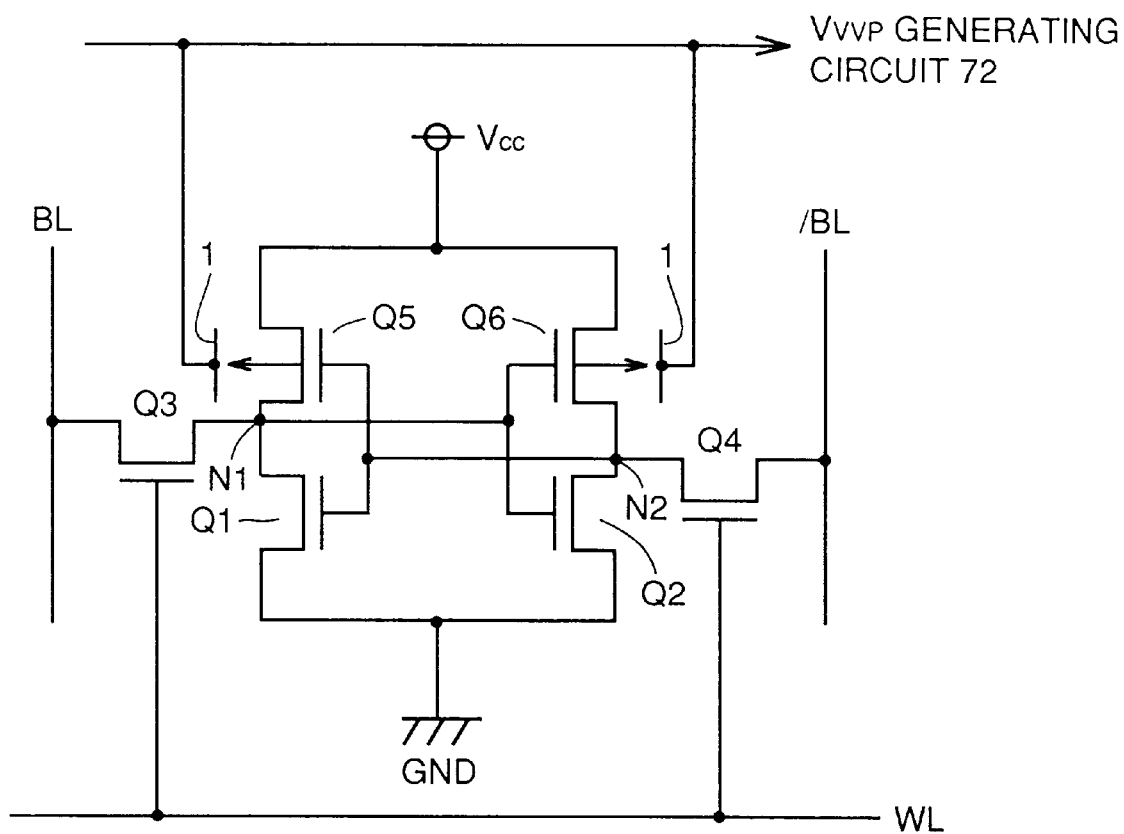
FIG. 1 is an equivalent circuit diagram of a memory cell in an SRAM according to Embodiment 1 of the present invention.

Referring to FIG. 1, a memory cell of an SRAM according to the present embodiment differs from the conventional example in that variable voltage plates (VVP) 1 are provided at the rear sides of channels of thin film transistors forming the load transistors Q5 and Q6. These VVP1 are electrically connected to a VVP voltage ($V_{VVP}$) generating circuit 72. As a result, VVP1 is at a GND potential when active, and at Vcc potential during standby.

Here, active means that reading/writing can be performed to the memory cell array, and standby means that data is merely held.

Figure 42:
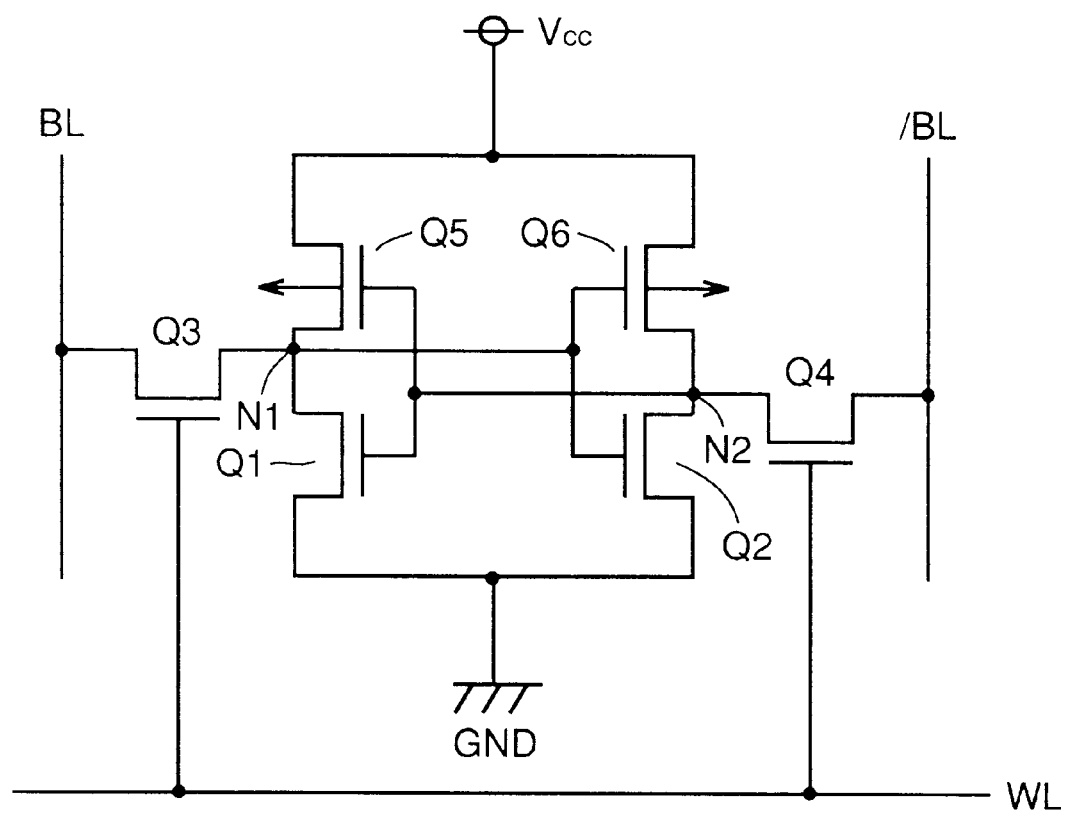
FIG. 42 is an equivalent circuit diagram showing a memory cell structure of a SRAM in general.
Figure 43:
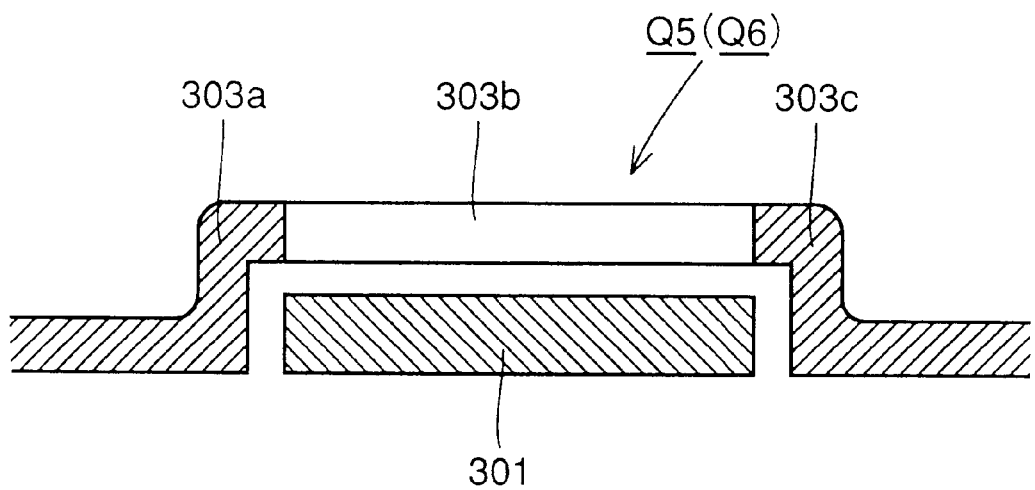
FIG. 43 is a schematic cross sectional view showing a structure of a load transistor of a bottom-gate type adopted for the memory cell structure of a conventional SRAM.
Figure 44:
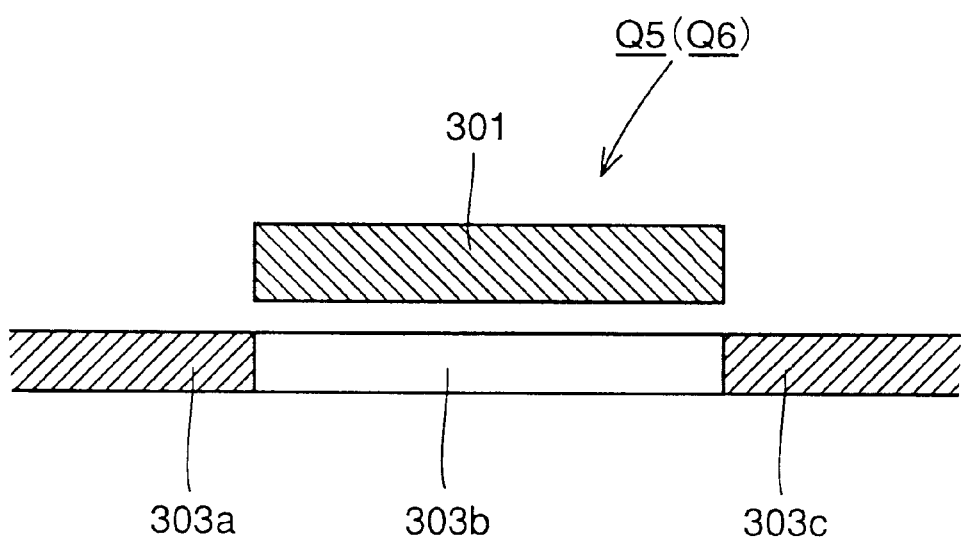
FIG. 44 is a schematic cross sectional view showing a structure of a load transistor of a top-gate type adopted for the memory cell structure of the conventional SRAM.
Figure 45:
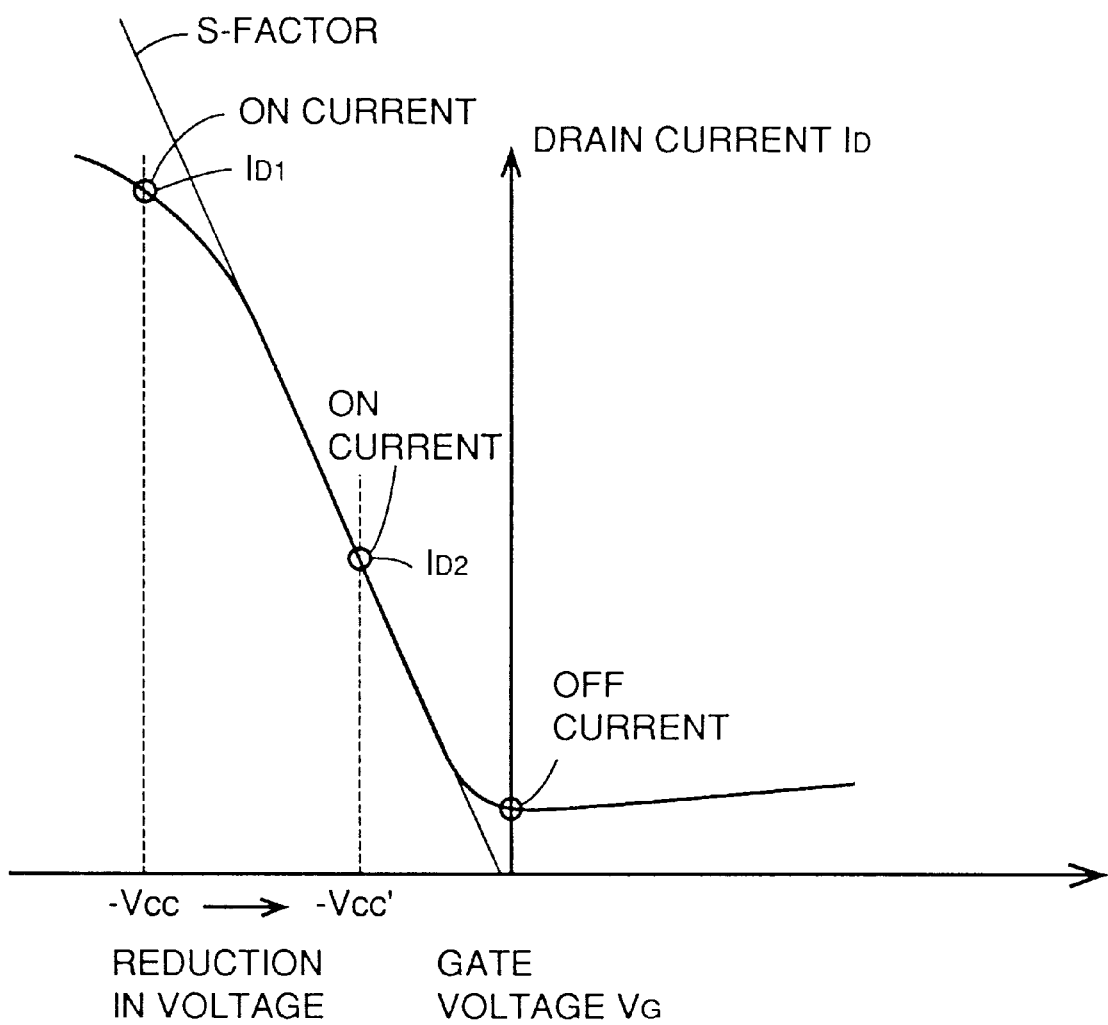
FIG. 45 is a graph showing the characteristics in relation to gate voltage $V_G$–drain current $I_D$ of the TFT.
Figure 46:
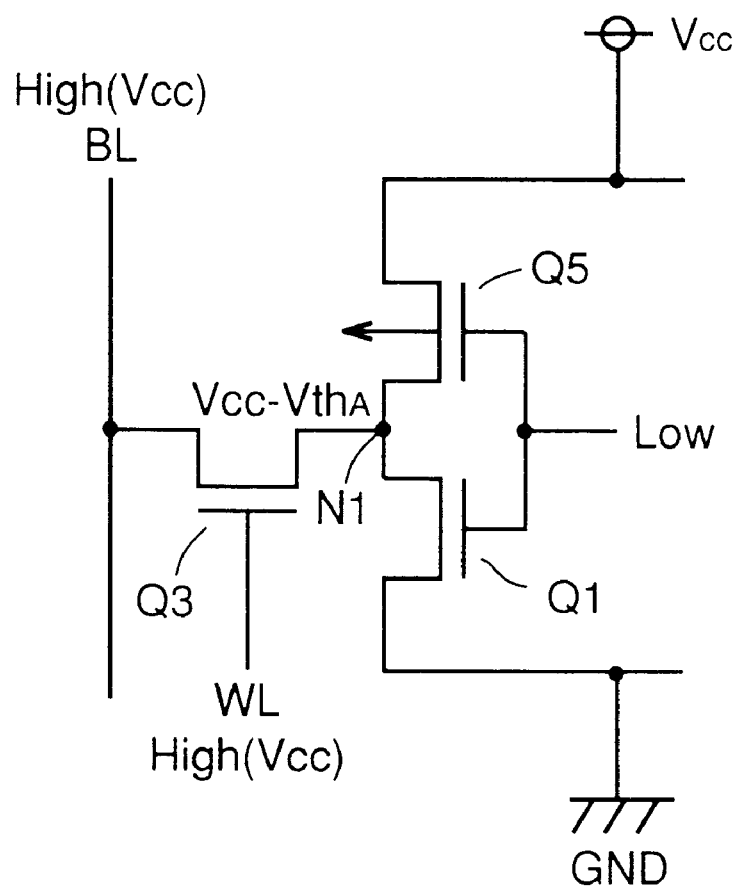
FIG. 46 is an equivalent circuit diagram showing the voltage at the portion of the storage node where High immediately after reading or writing is stored.

Since other portions of the structure are substantially similar to those of the conventional example described with reference to FIG. 42, the same members are denoted by the same reference characters and description thereof is not given.

Specific structure of the memory cell in the SRAM according to the present embodiment will now be described.

Figure 2A:
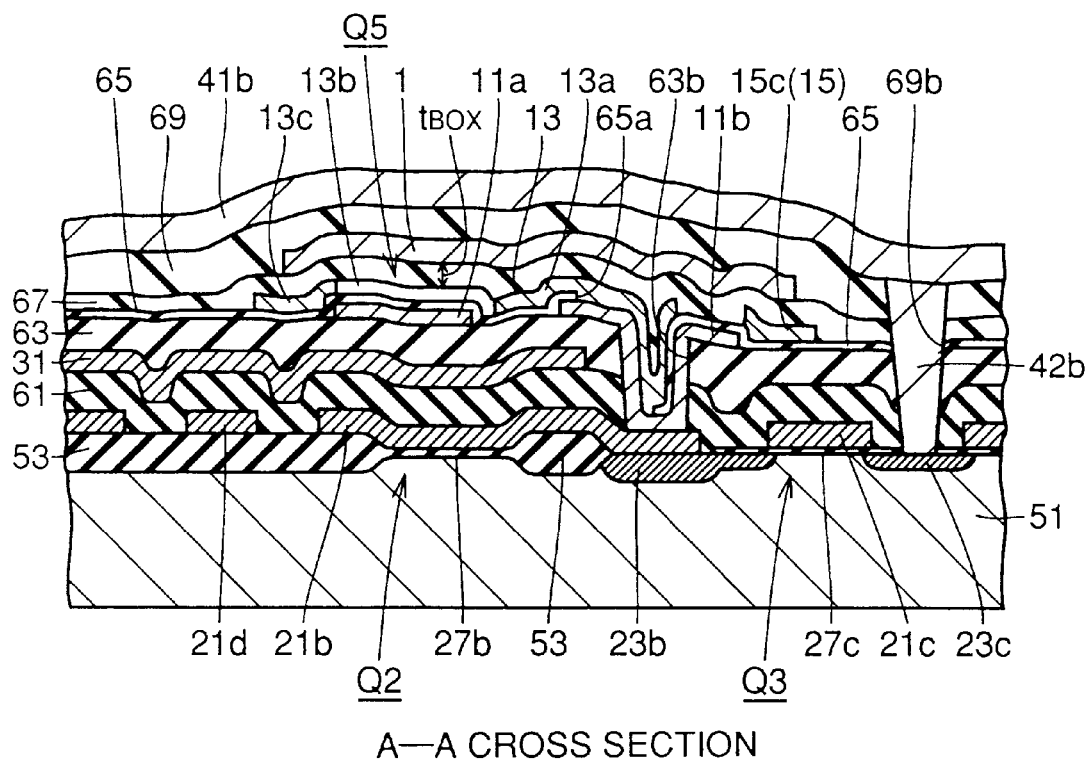
FIGS. 2A and 2B are schematic cross sectional views showing a structure of a semiconductor memory device according to Embodiment 1 of the present invention, taken along lines A—A and B—B in FIGS. 3 to 8, respectively.
Figure 2B:
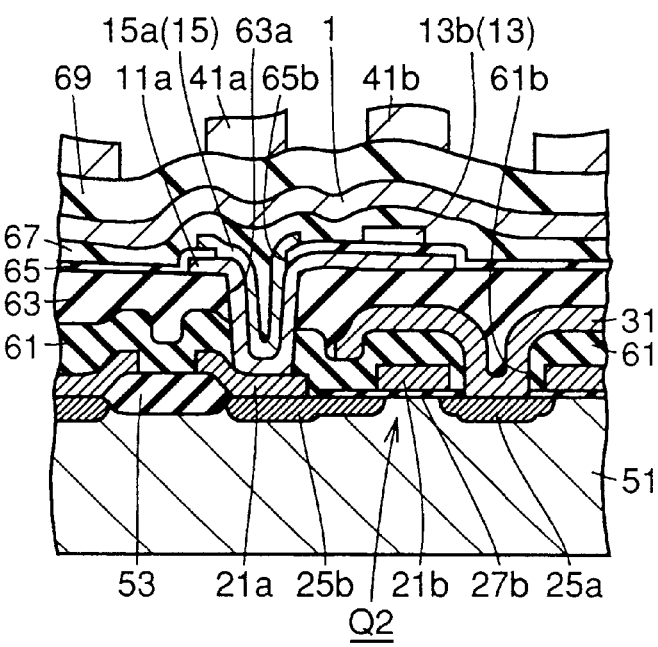

FIGS. 2A and 2B are diagrams corresponding to cross sections taken along lines A—A and B—B of FIGS. 3 to 8, respectively.

Figure 3:
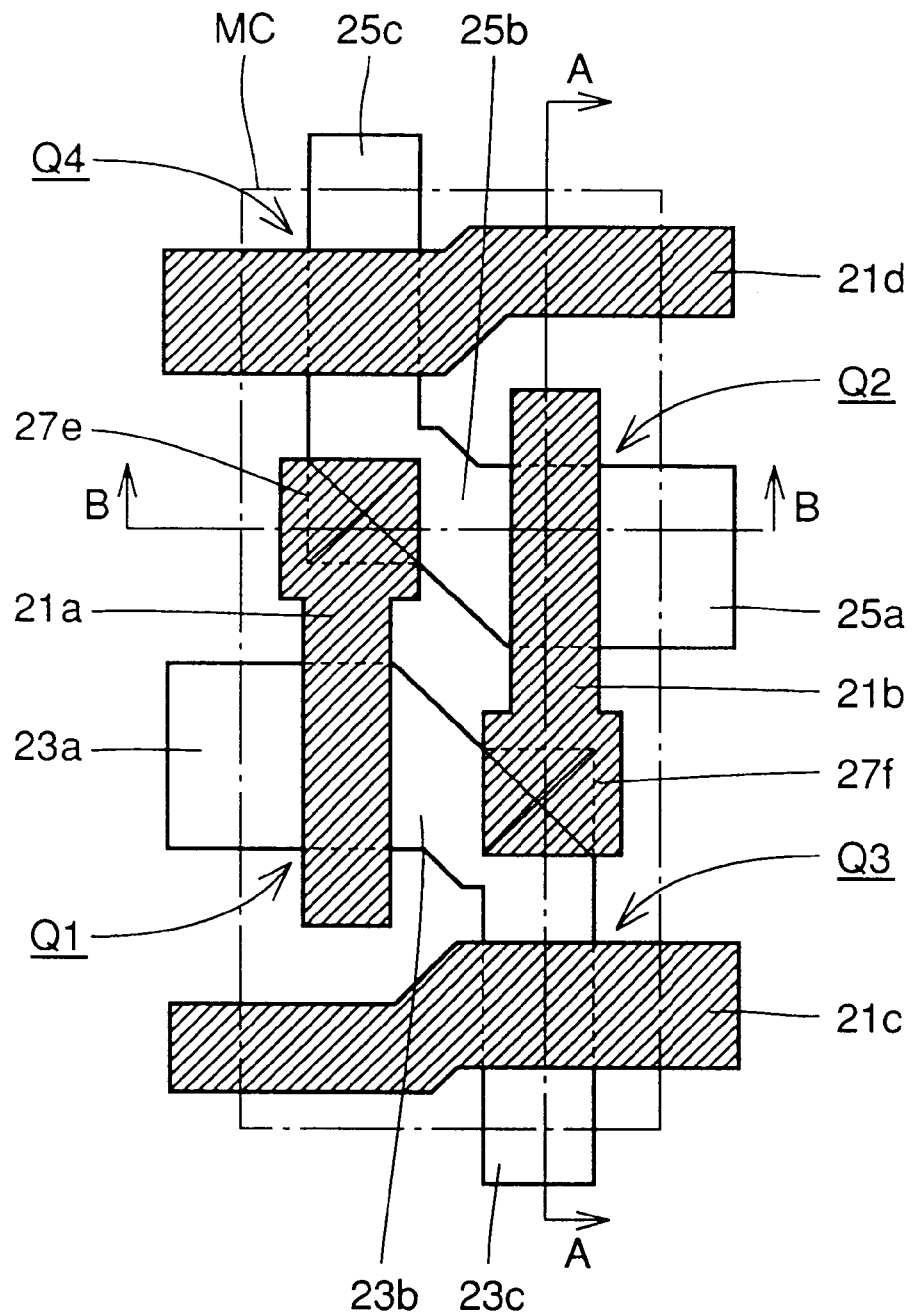
FIGS. 3 to 8 are plan views showing the structure of the memory cell in the SRAM according to Embodiment 1 of the present invention successively from the lower layer to the upper layer.
Figure 4:
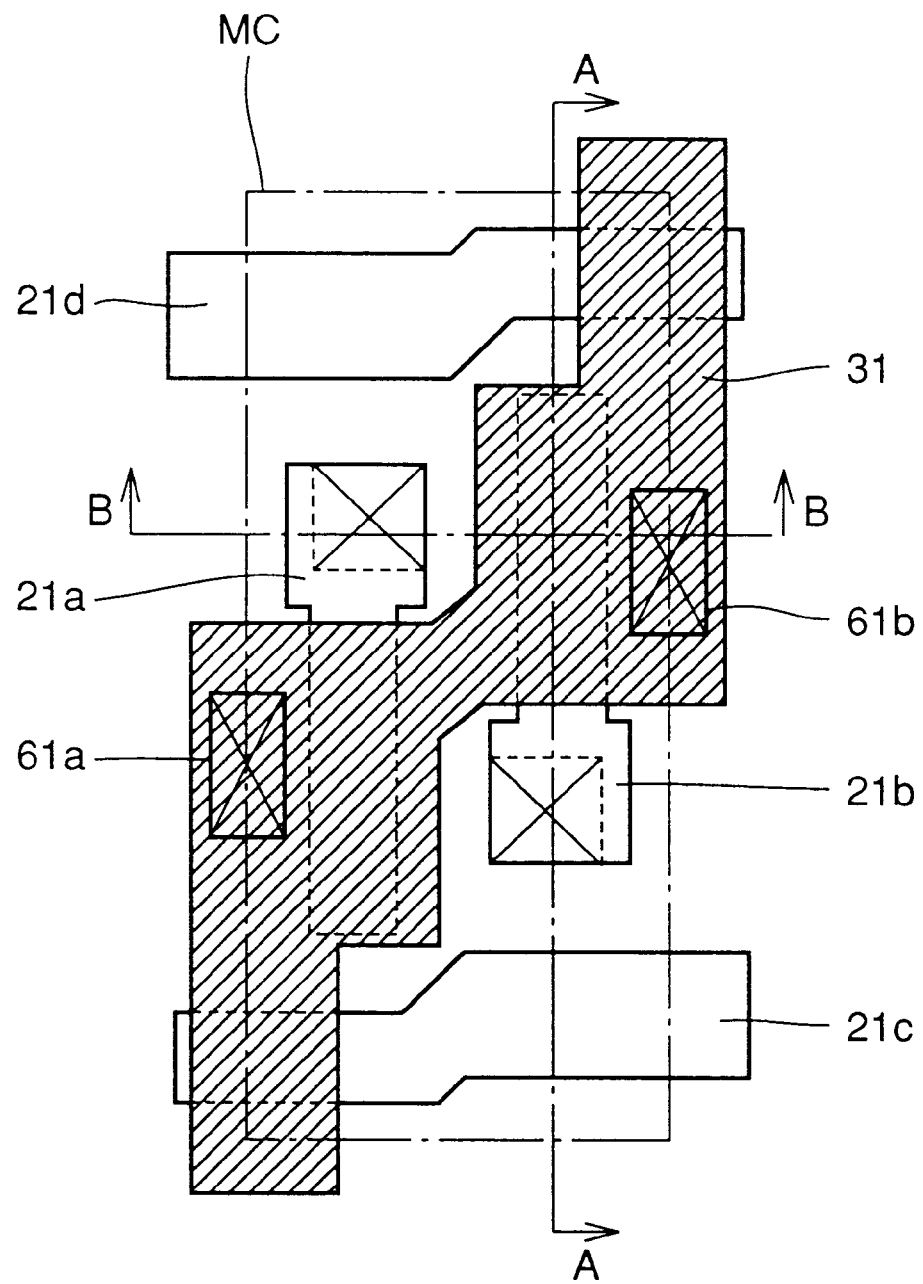
Figure 5:
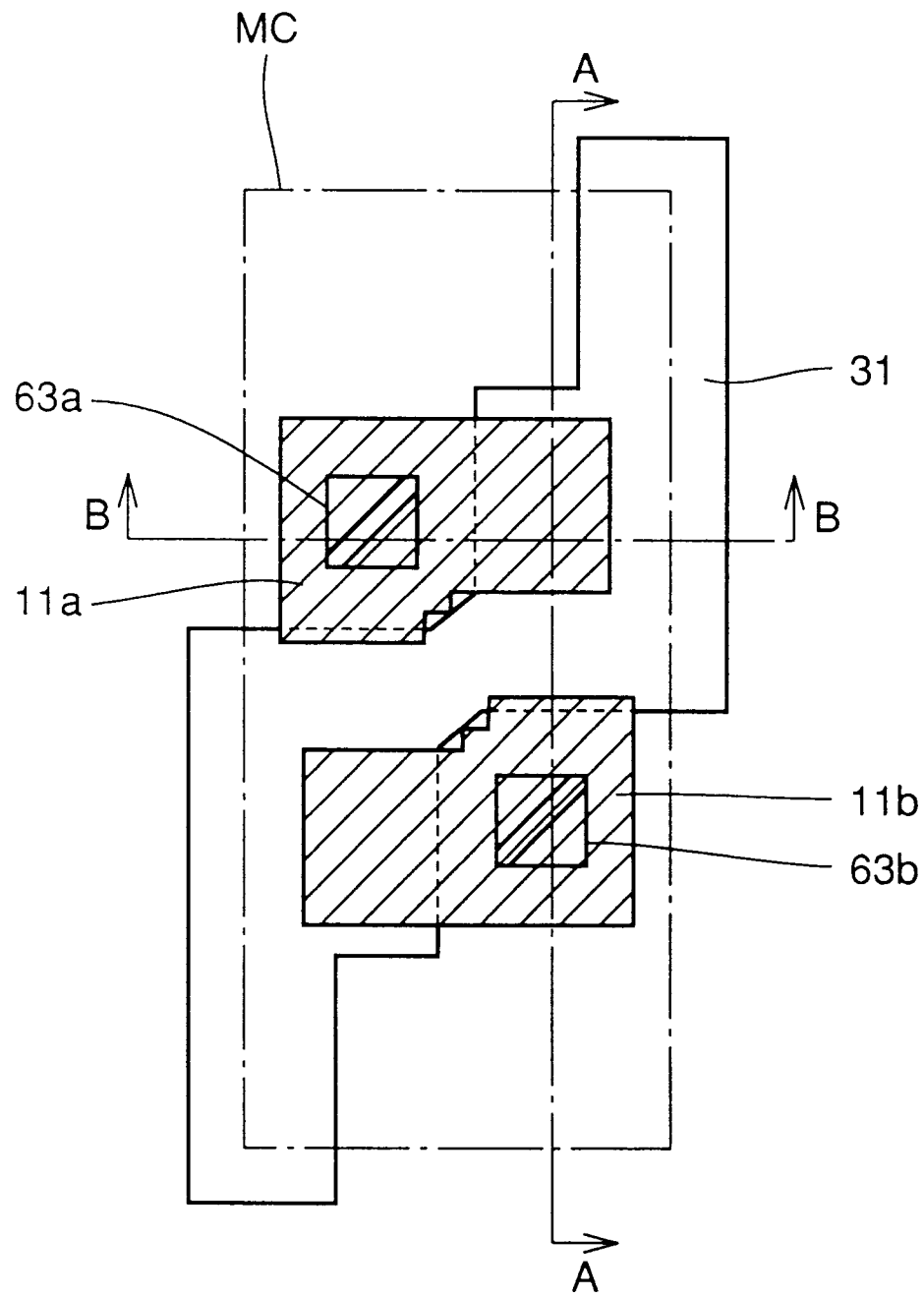
Figure 6:
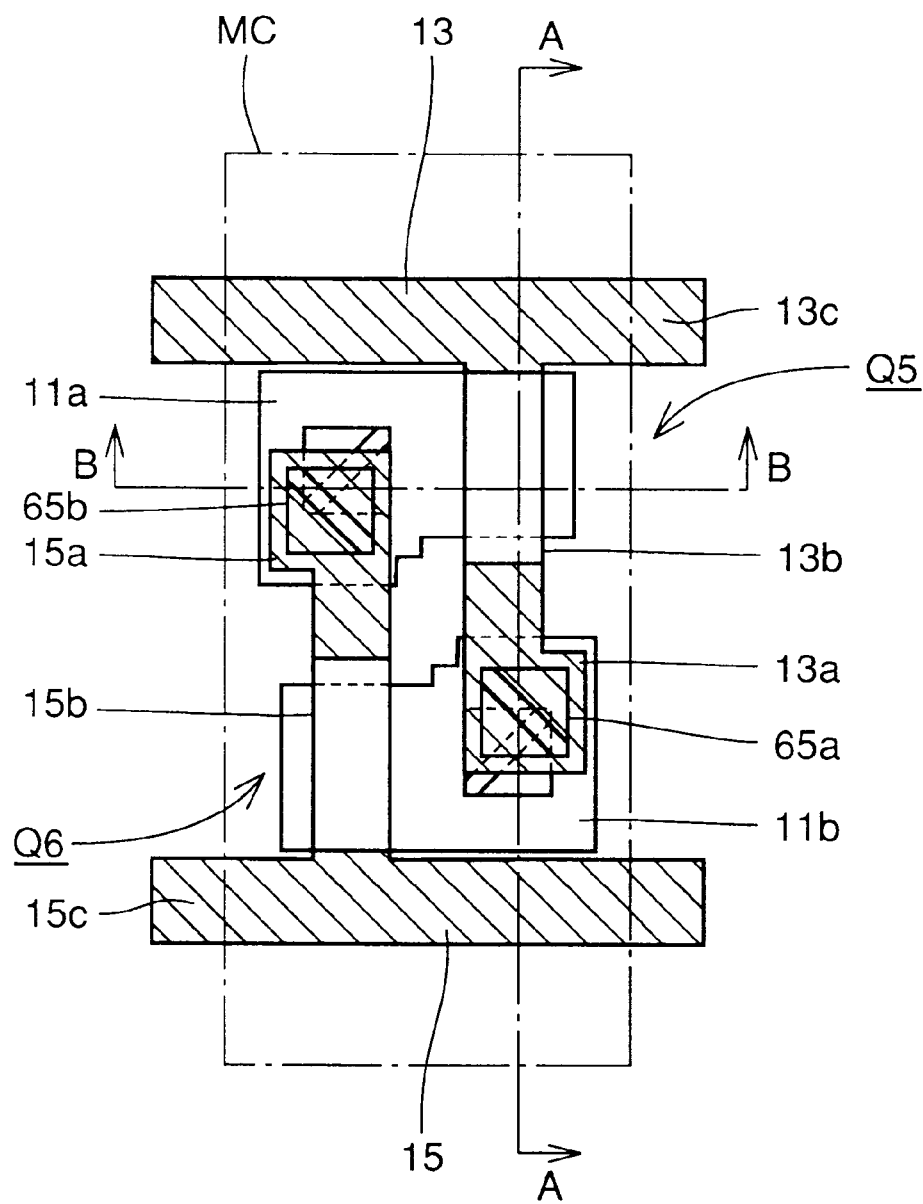
Figure 7:
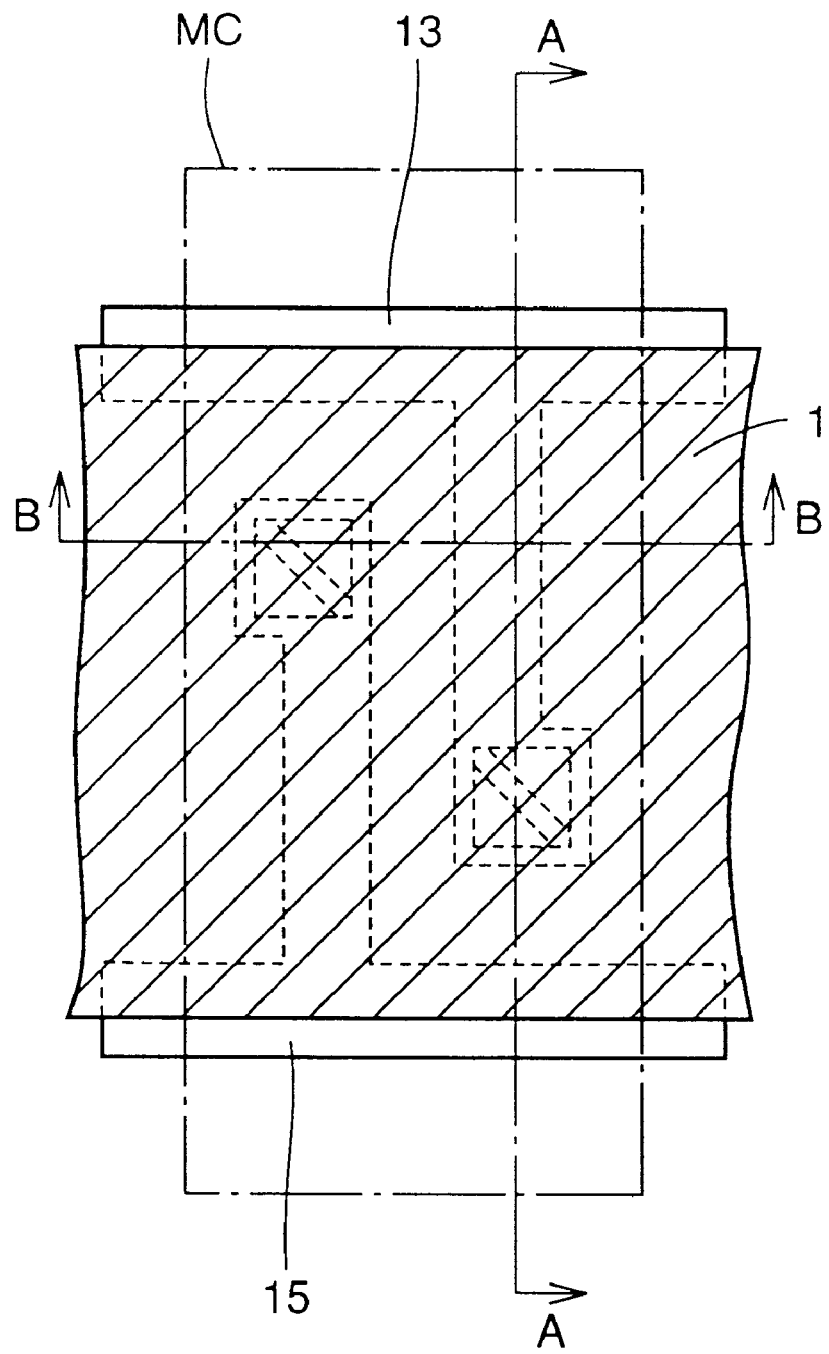
Figure 8:
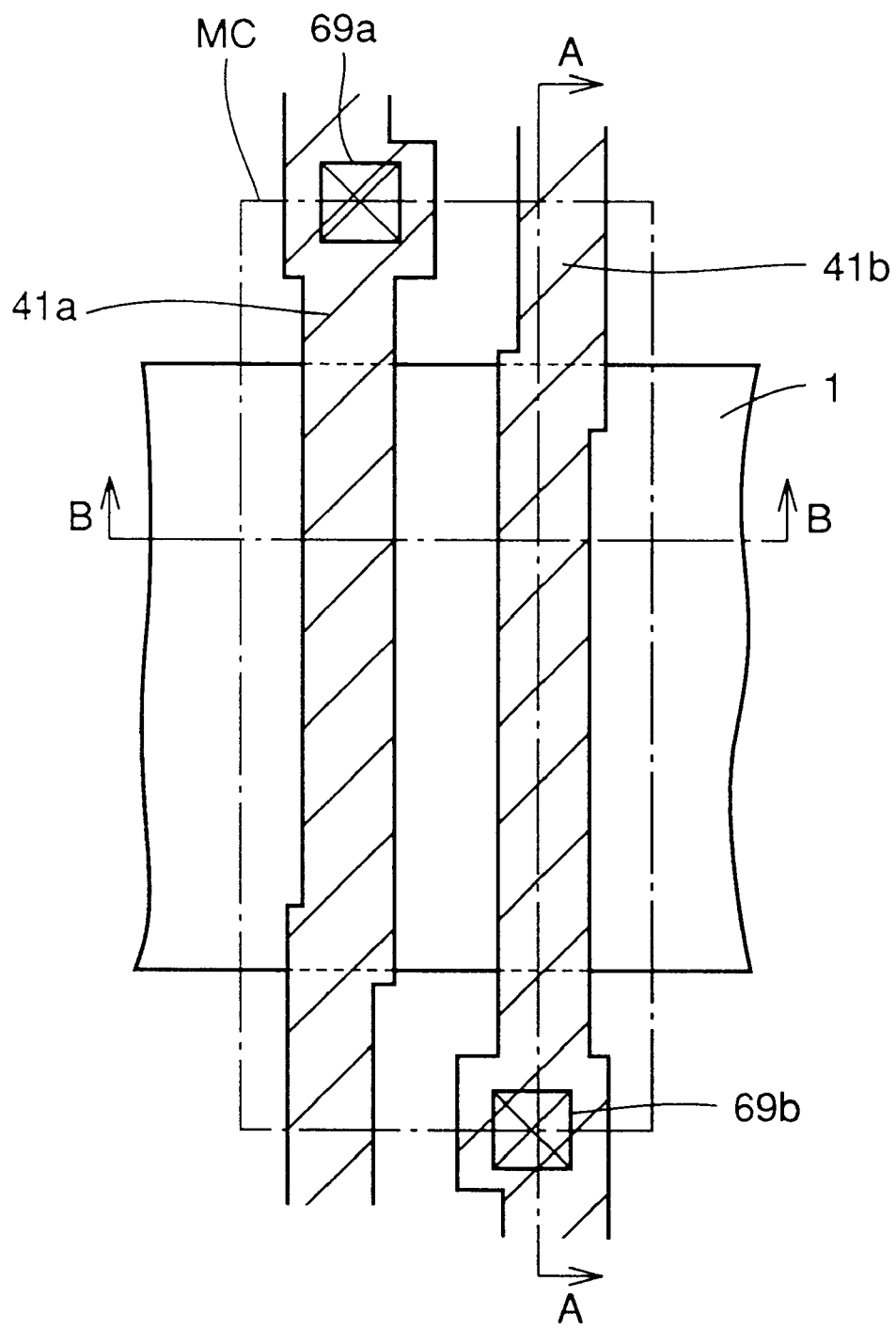

In particular, FIG. 3 shows the structure of a pair of driver transistors Q1, Q2 and a pair of access transistors Q3, Q4 formed on a substrate. FIG. 4 shows a structure of a conductive layer for ground, and FIGS. 5 and 6 show the structure of a pair of load transistors Q5, Q6. FIG. 7 shows a structure of a VVP, and FIG. 8 shows a structure of a pair of bit lines.

Referring mainly to FIGS. 2A, 2B and 3, a region MC surrounded by an alternate long and short dash line (see FIG. 3) is a region in which one memory cell is formed (hereinafter referred to as a memory cell region). In this memory cell region MC, the pair of driver transistors Q1, Q2 and the pair of access transistors Q3, Q4 constituting the memory cell of the SRAM are formed on the surface of a semiconductor substrate 51.

Driver transistor Q1 has a pair of source/drain regions 23a, 23b, a gate insulating layer (not shown) and gate electrode layer 21a. The pair of source/drain regions 23a and 23b are formed of n type diffused regions and are arranged laterally in FIG. 3, being spaced apart by a predetermined distance to define a channel region. Gate electrode layer 21a is formed to be opposite to this channel region with the gate insulating layer therebetween, extending vertically in FIG. 3.

Driver transistor Q2 has a pair of source/drain regions 25a and 25b, a gate insulating layer 27b and a gate electrode layer 21b. The pair of source/drain regions 25a, 25b are formed of n type diffused regions and are arranged laterally in FIG. 3 with a prescribed distance between each other so as to define a channel region. Gate electrode layer 21b are formed to be opposite to the channel region with gate insulating layer 27b therebetween, extending vertically in FIG. 3.

Access transistor Q3 has a pair of source/drain regions 23b, 23c, a gate insulating layer 27c and a gate electrode layer 21c. The pair of source/drain regions 23b and 23c are formed of n type diffused regions and are arranged vertically in FIG. 3, being spaced apart by a predetermined distance from each other so as to define a channel region. Gate electrode layer 21c is formed to be opposite to the channel region with gate insulating layer 27c therebetween. In addition, this gate electrode layer 21c is integrated with a word line, and is extended to cross memory cell region MC laterally in FIG. 3.

Access transistor Q4 has a pair of source/drain regions 25b, 25c, a gate insulating layer (not shown) and a gate electrode layer 21d. A pair of source/drain regions 25b, 25c are formed of n type diffused regions and are arranged vertically in FIG. 3 being spaced apart from each other by a predetermined distance so as to define a channel region. Gate electrode layer 21d is formed to be opposite to the channel region with gate insulating layer therebetween. In addition, this gate electrode layer 21d is integrated with the word line, and is extended to traverse a memory cell region MC laterally in FIG. 3.

Source/drain region 23b of driver transistor Q1 and source/drain region 23b of access transistor Q3 are formed by a single n type diffused region. Source/drain region 25b of driver transistor Q2 and source/drain region 25b of access transistor Q4 are formed by a single n type diffused region. Gate electrode layer 21a is electrically connected to n type diffused region 25b through a contact hole 27e provided at the insulating layer. Gate electrode layer 21b is electrically connected to n type diffused region 23b through contact hole 27f provided at the insulating layer.

Referring mainly to FIGS. 2A, 2B and 4, an insulating layer 61 is formed to cover the pair of driver transistors Q1, Q2 and a pair of access transistors Q3, Q4. Contact holes 61a and 61b are formed at this insulating layer 61.

A conductive layer 31 for ground is formed on insulating layer 61, such that it is electrically connected to source/drain region 23a of driver transistor Q1 through contact hole 61a and electrically connected to source/drain region 25a of driver transistor Q2 through contact hole 61b. In addition, this conductive layer 31 for ground extends along a diagonal of the rectangular shape defining the memory cell region MC, as shown in FIG. 4.

Referring mainly to FIGS. 2A, 2B and 5, an insulating layer 63 is formed to cover a conductive layer 31 for ground. Contact holes 63a and 63b are formed at insulating layer 63 and 61 so as to penetrate these insulating layers. A gate electrode layer 11a of load transistor Q5 is formed on insulating layer 63 such that it is connected electrically to gate electrode layer 21a of driver transistor Q1 through this contact hole 63a. A gate electrode layer 11b of load transistor Q6 is formed on insulating layer 63 such that it is connected electrically to gate electrode layer 21b of driver transistor Q2 through contact hole 63b. Gate electrode layers 11a and 11b are provided such that they are electrically insulated from each other.

Referring mainly to FIGS. 2A, 2B and 6, an insulating layer 65 of, for example, silicon oxide film is formed to cover load transistors Q5 and Q6. Insulating layer 65 is provided with openings 65a and 65b. A first semiconductor layer 13 of, for example, polycrystalline silicon is formed on insulating layer 65 such that it is connected electrically to gate electrode layer 11b of load transistor Q6 through this opening 65a. In addition, a second semiconductor layer 15 of, for example, polycrystalline silicon is formed such that it is connected electrically to gate electrode layer 11a of load transistor Q5 through opening 65b.

A pair of source/drain regions 13a and 13c are formed at the first semiconductor layer 13 to define a channel region 13b. A p type impurity is introduced to this pair of source/drain regions 13a and 13c. In addition, a pair of source/drain regions 15a and 15c are formed at the second semiconductor layer 15 to define a channel region 15b. A p type impurity is introduced to this pair of source/drain regions 15a and 15c.

Source/drain region 13c of first semiconductor layer 13 and source/drain region 15c of second semiconductor layer 15 are connected electrically to power supply potential (Vcc). First and second semiconductor layers 13 and 15 are provided in memory cell region MC, being separated from each other.

These first and second load transistors Q5 and Q6 are offset type transistors.

Referring mainly to FIGS. 2A, 2A and 7, an insulating layer 67 of, for example, silicon oxide film is formed to cover first and second semiconductor layers 13 and 15. On this insulating layer 67, a variable voltage plate (VVP) layer 1 is formed to cover at least channel regions 13b and 15b of first and second semiconductor layers. This VVP layer 1 is of, for example, polycrystalline silicon to which an impurity is introduced (hereinafter referred to as doped polycrystalline silicon), silicide, tungsten (W), aluminum (Al) or the like.

Referring mainly to FIGS. 2A, 2B and 8, an insulating layer 69 is formed to cover VVP layer 1. Contact holes 69a and 69b are formed at insulating layers 69, 67, 65, 63, 61 and the like, penetrating these layers. A bit line 41a is formed on insulating layer 69 such that it is connected electrically to source/drain region 25c of access transistor Q4 through contact hole 69a. A bit line 41b is formed on insulating layer 69 such that it is connected electrically to source/drain region 23c of access transistor Q3 through contact hole 69b. These bit lines 41a and 41b extend so as to traverse memory cell region MC, in a vertical direction in FIG. 8. These bit lines 41a and 41b are of, for example, aluminum.

The state of connection of VVP in the SRAM according to the present embodiment will now be described.

Figure 9:
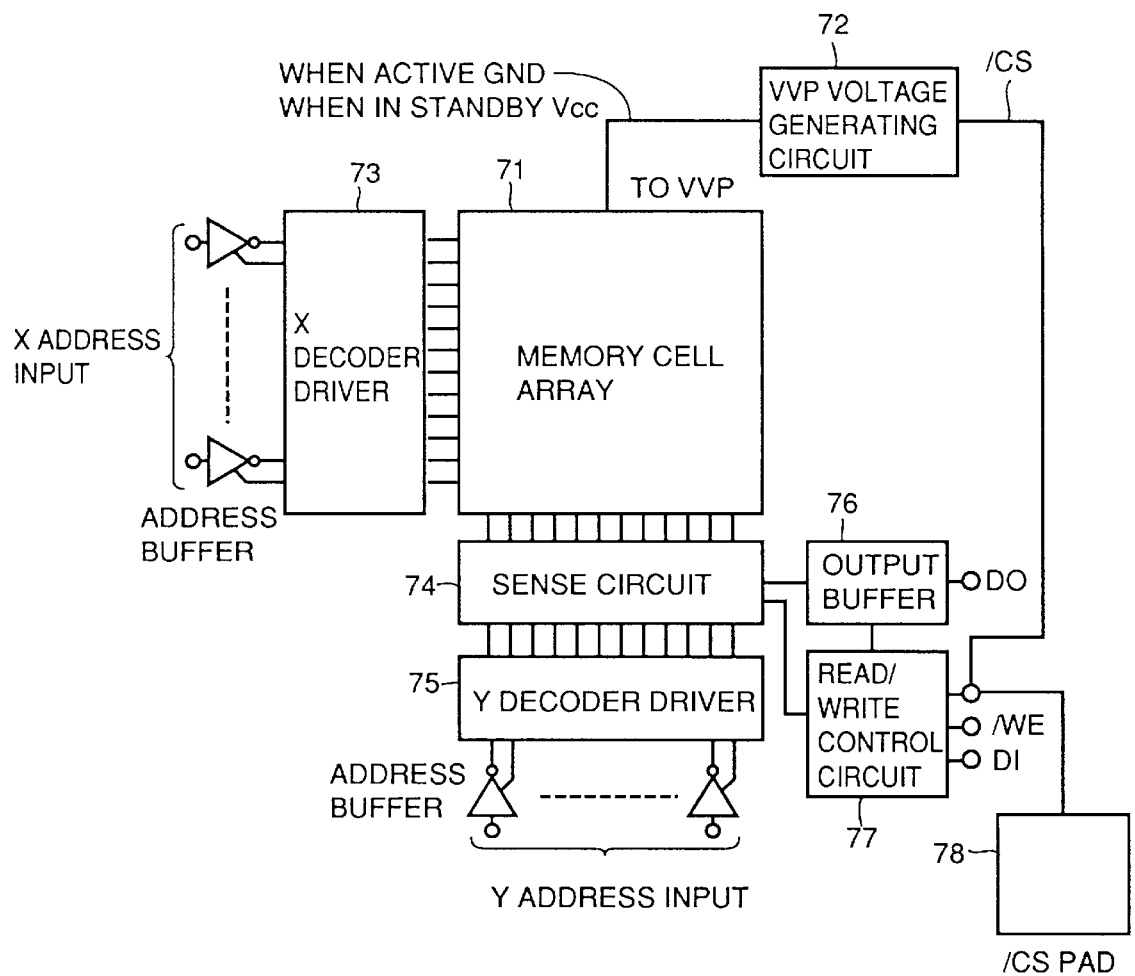
FIG. 9 is a schematic block diagram showing the structure of the SRAM according to Embodiment 1 of the present invention.

Referring to FIG. 9, the SRAM has a memory cell array 71, a VVP voltage ($V_{VVP}$) generating circuit 72, an X decoder driver 73, a sense circuit 74, a Y decoder driver 75, an output buffer 76 and a read/write control circuit 77.

Memory cell array 71 serves to accumulate the data signal of the stored information. X decoder driver 73 and Y decoder driver 75 serve to decode X and Y address signals input externally so as to designate the memory cell. Sense circuit 74 serves to amplify and read the accumulated signal. Output buffer 76 and read/write control circuit 77 serve to input or output the data. VVP voltage generating circuit 72 serves to receive a signal from /CS pad 78 and conducts this signal to VVP layer within memory cell array 71.

Figure 10:
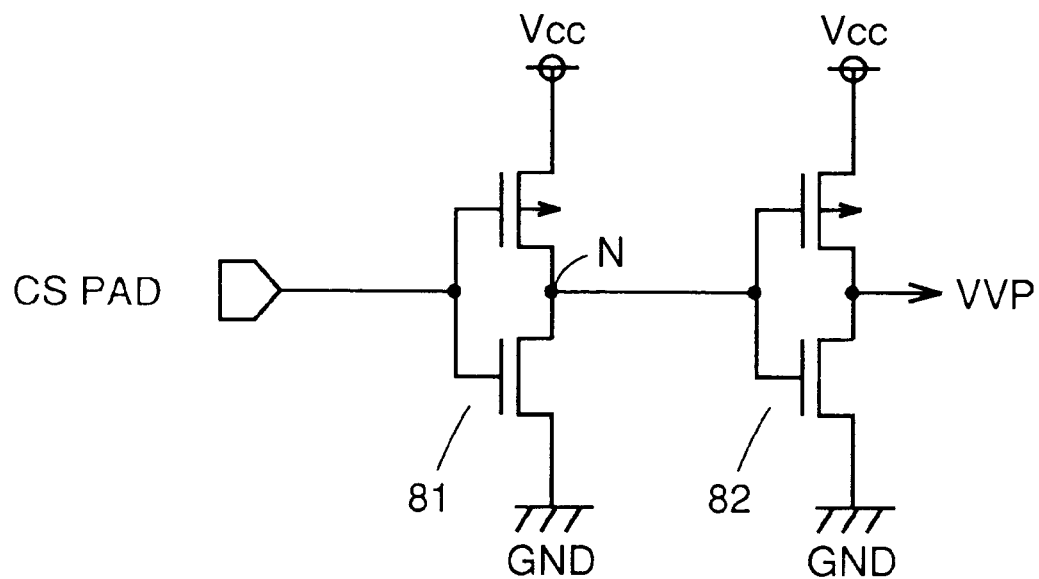
FIG. 10 is a circuit diagram showing a structure of a VVP voltage generating circuit.

This VVP voltage generating circuit 72 is formed of two inverter circuits 81 and 82, as shown in FIG. 10.

Figure 11:
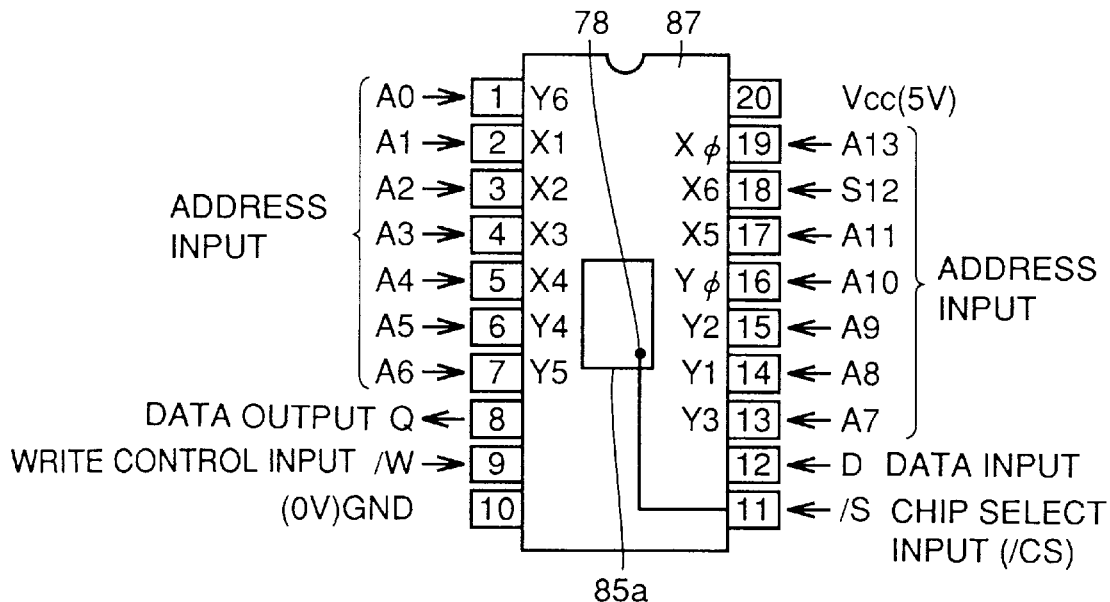
FIG. 11 is a schematic plan view showing a structure of a package according to Embodiment 1 of the present invention.
Figure 12:
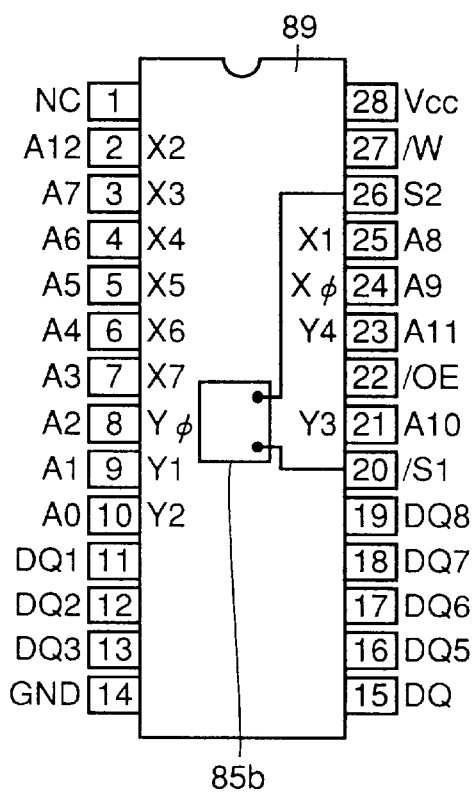
FIG. 12 is a schematic plan view showing a structure of another package according to Embodiment 1 of the present invention.

The semiconductor chip having the SRAM of the present embodiment as described above is incorporated into a package as shown in FIGS. 11 and 12.

Referring to FIG. 11, with a semiconductor chip 85a being incorporated in a package 87, /CS pad 78 of semiconductor chip 85a is connected electrically to a /S chip select input (/CS) pin.

In addition, in a package 89 having a pin arrangement shown in FIG. 12 including eight more pins than the arrangement described above, there are two chip select signal input pins, /S1 and S2. In this case, /CS signal is input to VVP voltage generating circuit 72 shown in FIG. 9 via logic circuit of FIG. 13.

Figure 13:
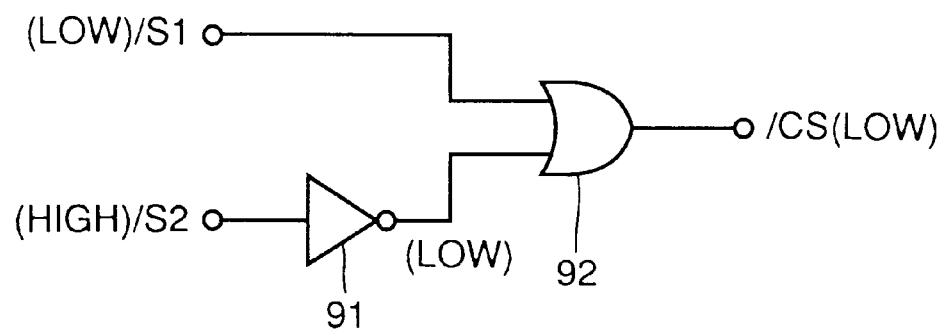
FIG. 13 is a diagram showing a logic circuit to obtain a /SC signal in the package shown in FIG. 12.

Logic circuit shown in FIG. 13 has an inverter circuit 91 and OR circuit 92. Pin /S1 is connected to VVP voltage generating circuit via OR circuit 92 and pin S2 is connected to VVP voltage generating circuit via inverter circuit 91 and OR circuit 92.

In such logic circuit, when Low signal is input to /S1 and High signal is input to S2 respectively, for example, Low signal is obtained as /CS signal and is conducted to VVP voltage generating circuit.

Here, a chip select pin refers to a pin which applies Low when active and High during standby to indicate the state internally to the chip.

In addition, VVP voltage generating circuit 72 can be formed of, for example, two inverters 81, 82 and connected to VVP layer 1 so as to generate the above-described $V_{VVP}$. The number of the inverters is not limited to 2 as long as it is an even number.

Since this VVP voltage generating circuit 72 is formed of a C (Complementary) MOS inverter, a so-called penetrating current is reduced, which penetrating current being a current accumulated in node N of FIG. 10 flowing into GND when the switch of the inverter is turned on or off. Accordingly, as compared to a substrate voltage generating circuit employed in a DRAM (Dynamic Random Access Memory) in which a large amount of current is consumed, current consumption can be made smaller in this VVP voltage generating circuit 72.

These packages shown in FIGS. 11 and 12 are further mounted to printed boards.

Figure 14:
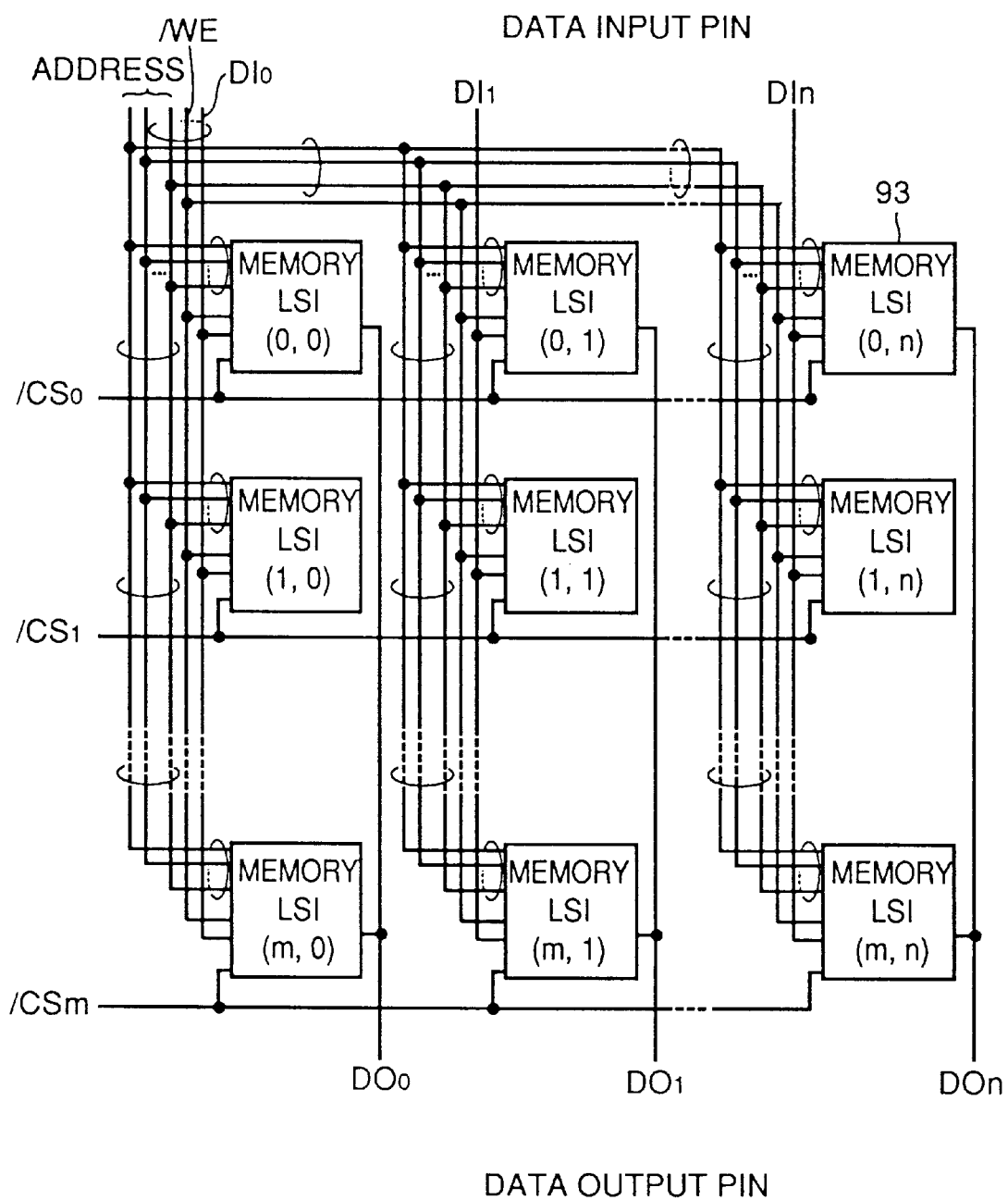
FIG. 14 is a diagram showing the wiring of a printed board to which a package is mounted according to Embodiment 1 of the present invention.

Referring to FIG. 14, memory LSIs (Large Scale Integrated Circuit) 93 formed of SRAM chip are arranged in a matrix of m×n. Respective chip select pins of memory LSIs 93 arranged laterally in the figure are connected electrically with one another. /$CS_0$, /$CS_1$, . . . /$CS_m$ signals can be input to every memory LSI 93 arranged laterally in the figure.

In addition, each memory LSI 93 is in connection with data input pin which conducts signals $DI_0$, $DI_1$, . . . $DI_n$ and data output pin which conducts signals $DO_0$, $DO_1$, . . . $DO_n$. An address signal and /CS signal can be input to each memory LSI 93.

A circuit to select/deselect the memory LSI 93 is provided at this printed board. More specifically, a circuit is provided by which circuit one of /$CS_0$, /$CS_1$, . . . /$CS_m$ signals is set at GND (Low) potential and memory LSI 93 to which that signal is input would be set at a selected state, while the other signals are set at Vcc (High) potential and memory LSIs 93 to which those signals are input are set at a deselected state.

A method of manufacturing the SRAM memory cell according to the present invention will be described next.

Figure 15A:
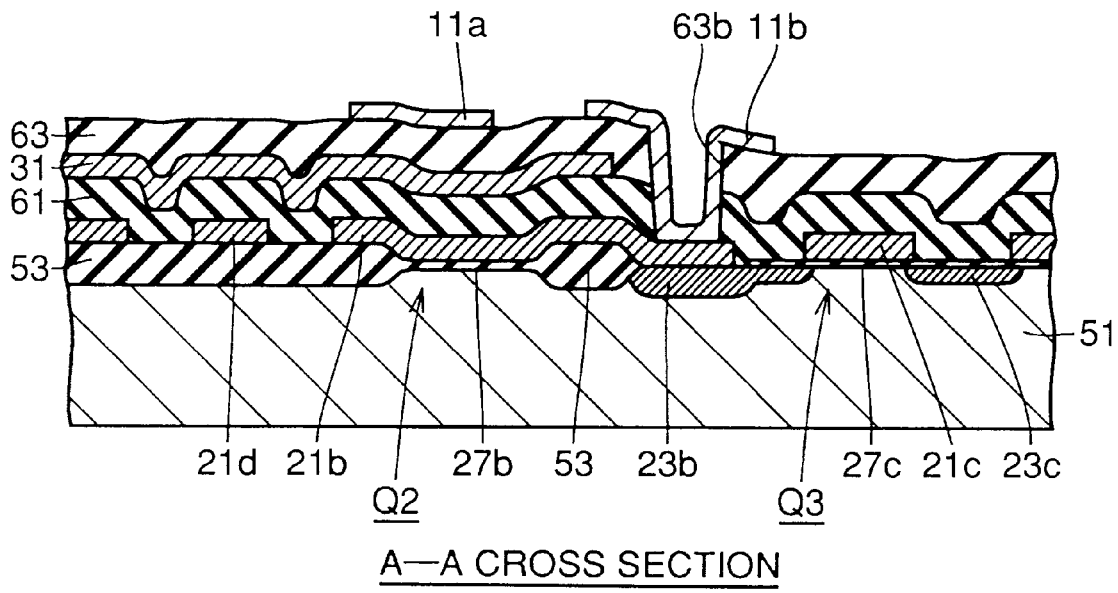
FIGS. 15A and 15B are schematic cross sectional views corresponding to FIGS. 2A and 2B, showing a first step in the manufacturing method of a memory cell structure in the SRAM according to Embodiment 1 of the present invention.
Figure 15B:
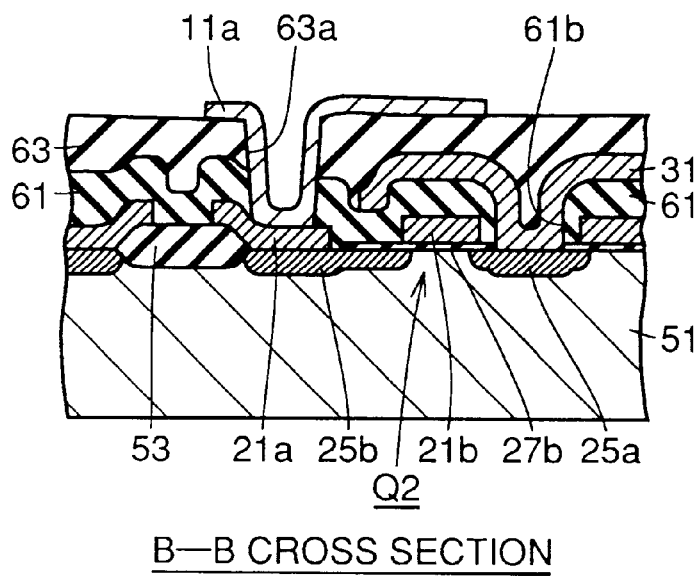

Referring first to FIGS. 15A and 15B, the surface of semiconductor substrate 51 is electrically isolated by isolating insulation film 53. To this isolated surface, driver transistors Q1, Q2 and access transistors Q3, Q4 are formed as shown in FIG. 3, respectively.

Insulating layer 61 is formed to cover these driver transistors Q1, Q2 and access transistors Q3, Q4. By ordinary photolithography and etching, contact hole 61a reaching source/drain region 23a of driver transistor Q1 and contact hole 61b reaching source/drain region 25a of driver transistor Q2 are formed at this insulating layer 61, as shown in FIG. 4.

Conductive layer 31 for ground is formed to have a desired shape shown in FIG. 4 so as to be connected electrically to source/drain region 23a of driver transistor Q1 and source/drain region 25a of driver transistor Q2 through these contact holes 61a and 61b. Insulating layer 63 is formed to cover this conductive layer 31 for ground. Contact hole 63a reaching gate electrode layer 21a of driver transistor Q1 and contact hole 63b reaching gate electrode layer 21b of driver transistor Q2 are formed at insulating layers 61 and 63 by ordinary photolithography and etching, penetrating these two layers.

A doped polycrystalline silicon layer is formed on insulating layer 63 so as to be electrically connected to each of gate electrode layers 21a and 21b through these contact holes 63a, 63b. Thereafter, this doped polycrystalline silicon layer is patterned to obtain a desired shape as shown in FIG. 5 by ordinary photolithography and etching. In this way, gate electrode layers 11a and 11b of load transistors Q5 and Q6 are formed. Gate electrode layer 11a is connected electrically to gate electrode layer 21a and gate electrode layer 11b is connected electrically to gate electrode layer 21b, respectively.

Figure 16A:
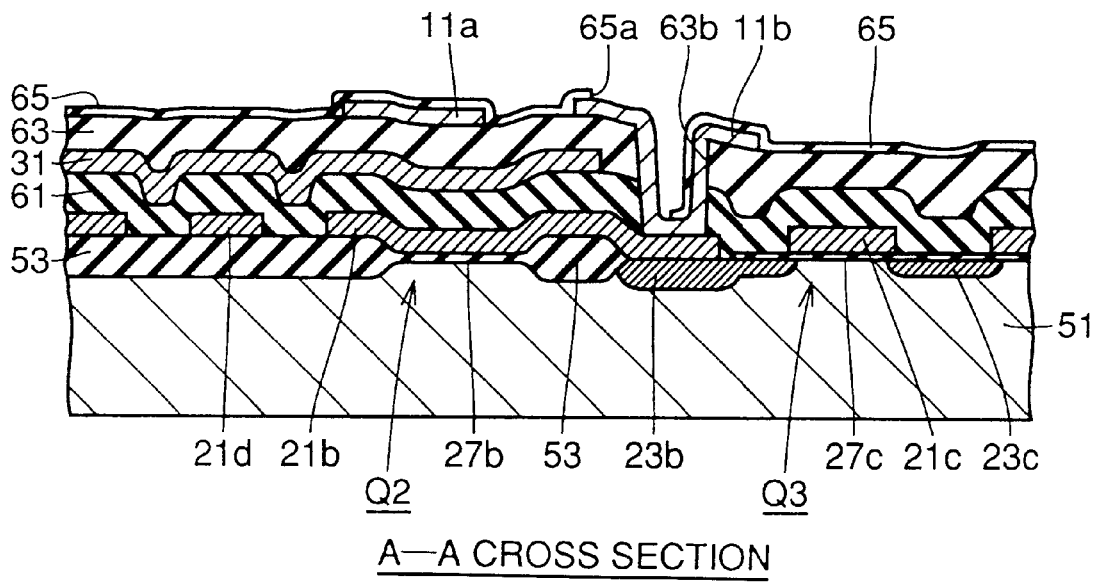
FIGS. 16A and 16B are schematic cross sectional views corresponding to FIGS. 2A and 2B, showing a second step in the manufacturing method of the memory cell structure in the SRAM according to Embodiment 1 of the present invention.
Figure 16B:
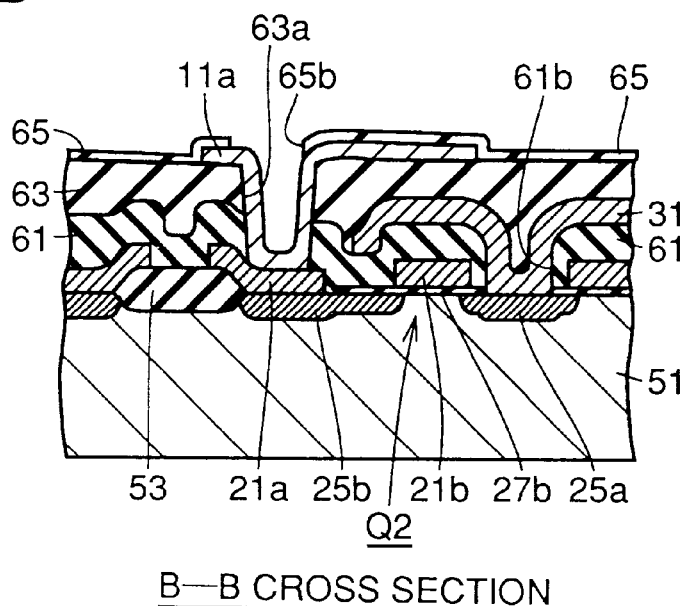

Referring to FIGS. 16A and 16B, insulating layer 65 of, for example, silicon oxide film is formed to cover gate electrode layers 11a and 11b by CVD (Chemical Vapor Deposition). This insulating layer 65 is formed to have a thickness of 20 nm, for example. Also, this insulating layer 65 may be formed by oxidizing the doped polycrystalline silicon of gate electrode layers 11a and 11b. Thereafter, openings 65a and 65b exposing portions of the surfaces of gate electrode layer 11a and 11b, respectively, are formed in insulating layer 65 by ordinary photolithography and etching.

Figure 17A:
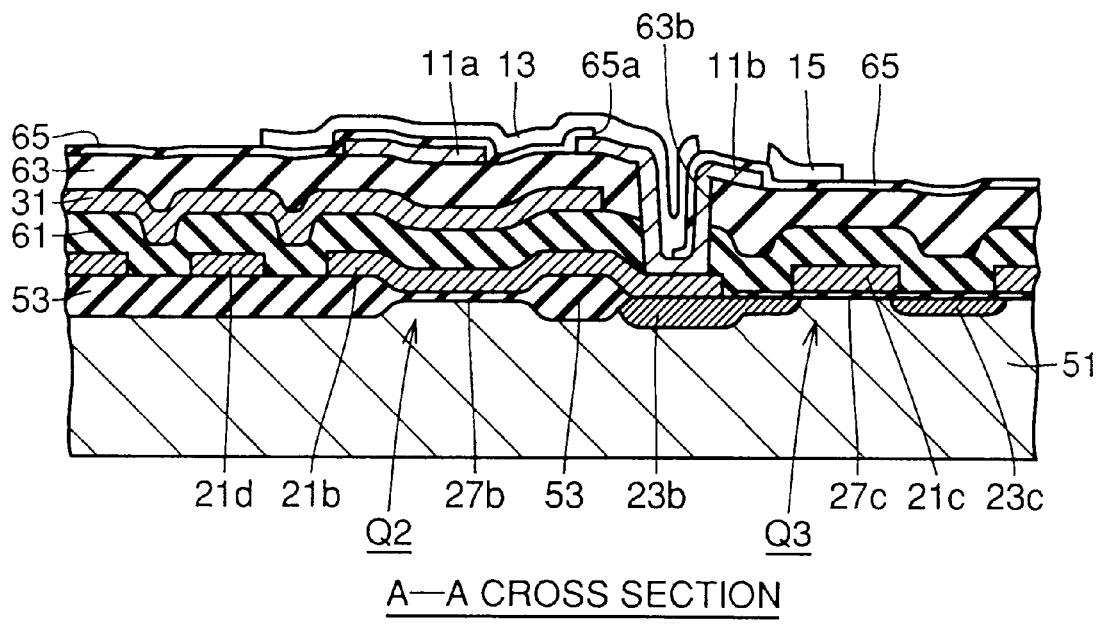
FIGS. 17A and 17B are schematic cross sectional views corresponding to FIGS. 2A and 2B, showing a third step in the manufacturing method of the memory cell structure in the SRAM according to Embodiment 1 of the present invention.
Figure 17B:
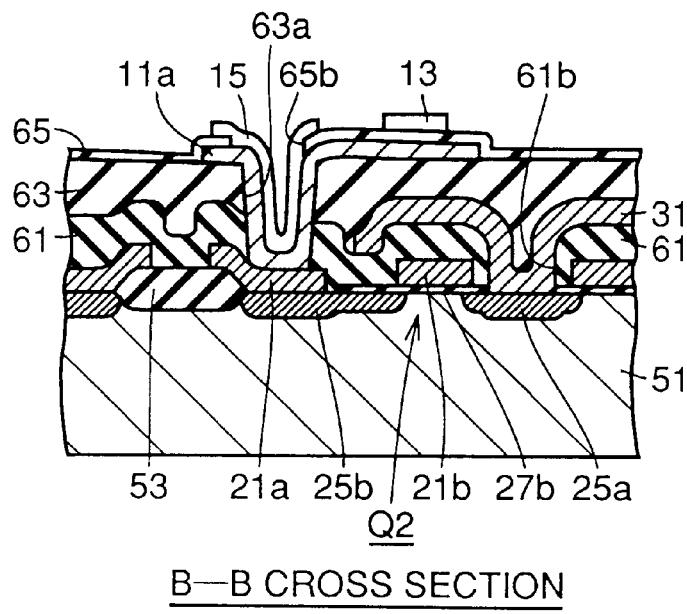

Referring to FIGS. 17A and 17B, amorphous silicon (a-Si) layer is deposited entirely on the surface of the substrate by using $Si_2H_6$ gas, for example, at a temperature of about 460° C. Annealing (or solid phase deposition) is performed on this amorphous silicon layer at a temperature of about 600° C. in an $N_2$ atmosphere for about 24 hours. Thus, a polycrystalline silicon layer having a film thickness of 30 nm is formed on insulating layer 65.

The film thickness of polycrystalline silicon layer may be achieved by forming an amorphous silicon layer to a thickness of 30 nm, or it may be achieved by performing a solid phase deposition of amorphous silicon layer to a thickness more than 30 nm and then making it thinner by a method such as etching or oxidization so as to obtain a film thickness of 30 nm.

Thereafter, $BF_2$, for example, is implanted to this polycrystalline silicon layers 13 and 15 as channel implantation with an implanting energy of 30 keV and dose of $1 \times 10^{12}/cm^2$. By this implantation, threshold voltage Vth at the time of standby is determined, and at the same time, OFF current at the time of standby is determined such that it is sufficiently low.

Thereafter, polycrystalline silicon layer is patterned by ordinary photolithography and etching. Thus, the first and second semiconductor layers 13 and 15 having a desired shape shown in FIG. 6 are formed.

To first and second semiconductor layers 13 and 15, a p type impurity is implanted with a resist mask formed on the portions of the first and second semiconductor layers 13, 15 which are to be the channel regions. The condition for this implantation is implanting energy of 30 keV and dose of $5 \times 10^{14}/cm^2$ when $BF_2$ is employed as impurity.

Figure 18A:
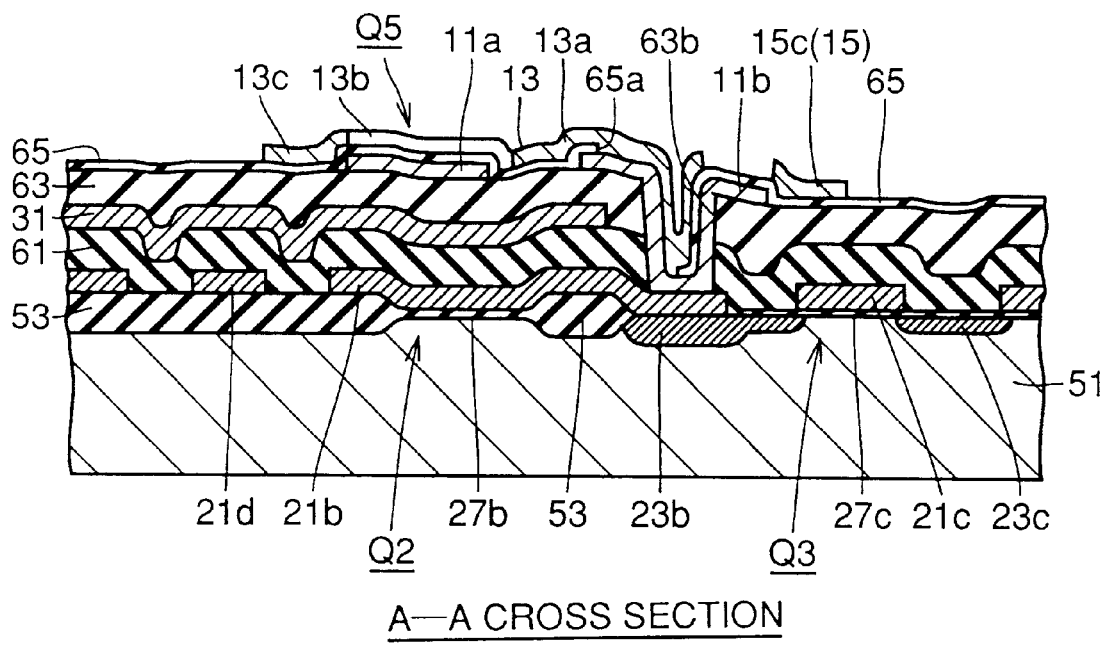
FIGS. 18A and 18B are schematic cross sectional views corresponding to FIGS. 2A and 2B, showing a fourth step in the manufacturing method of the memory cell structure in the SRAM according to Embodiment 1 of the present invention.
Figure 18B:
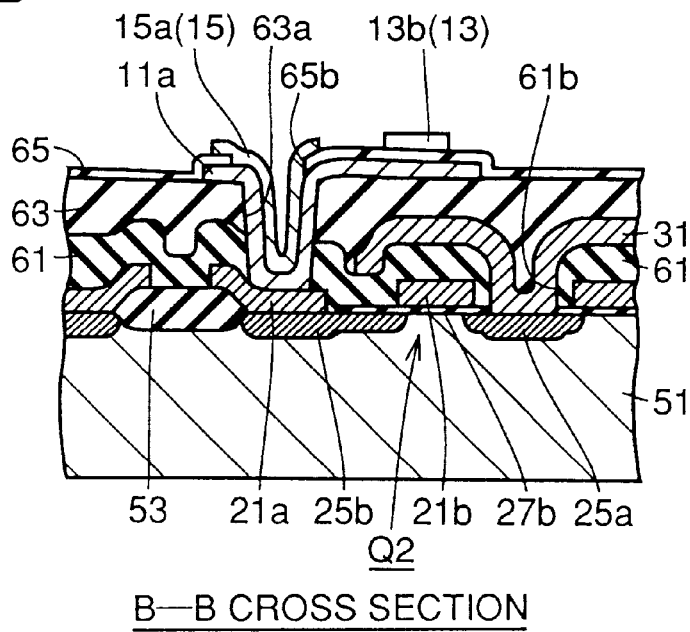

Referring to FIGS. 18A and 18B, a pair of source/drain regions 13a and 13c are formed at the first semiconductor layer 13 to define channel region 13b by this ion implantation. In addition, a pair of source/drain regions 15a and 15c are formed at the second semiconductor layer 15 to define channel region 15b.

Source/drain region 13a of first semiconductor layer 13 is formed to be connected electrically to gate electrode layer 11b through opening 65a. Source/drain region 15a of second semiconductor layer 15 is formed to be connected electrically to gate electrode layer 11a through opening 65b.

Figure 19A:
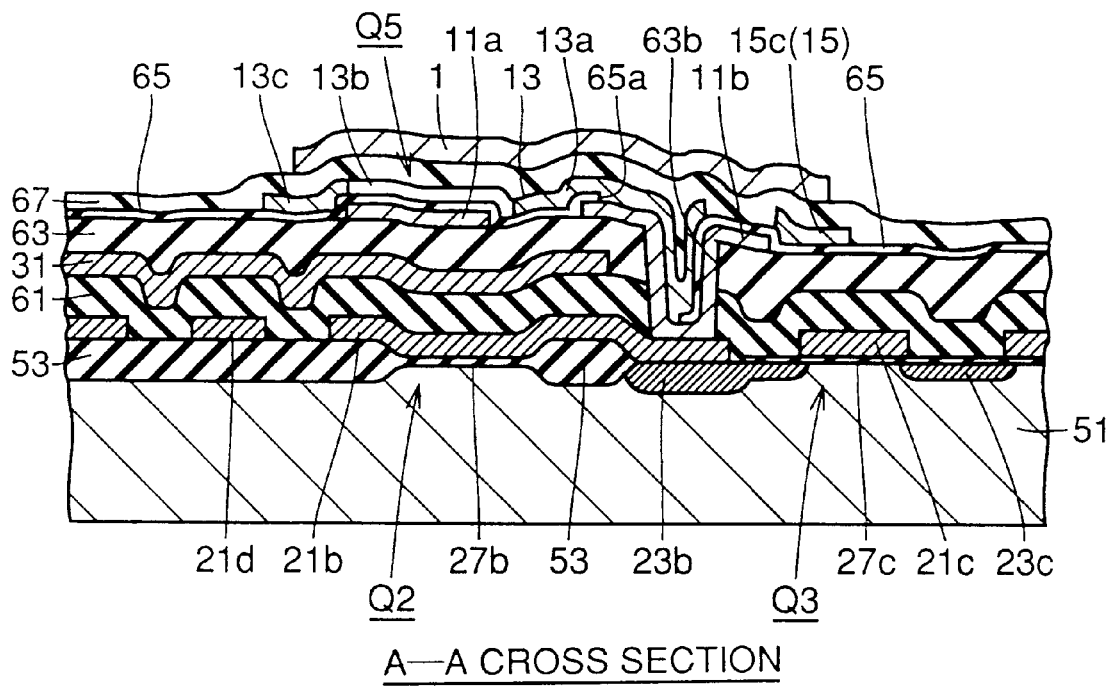
FIGS. 19A and 19B are schematic cross sectional views corresponding to FIGS. 2A and 2B, showing a fifth step in the manufacturing method of the memory cell structure in the SRAM according to Embodiment 1 of the present invention.
Figure 19B:
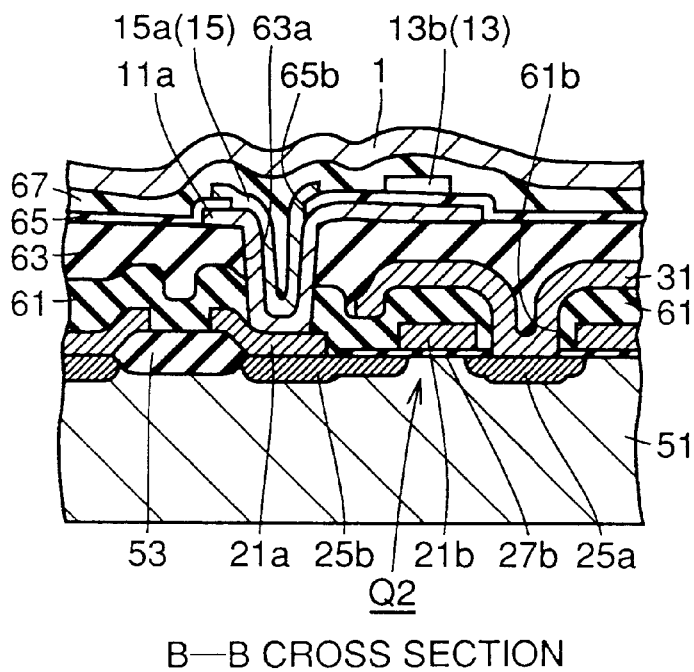

Referring to FIGS. 19A and 19B, an insulating layer 67 is formed entirely on the surface of the substrate to cover first and second semiconductor layers 13 and 15 by, for example, silicon nitride film or composite film of silicon nitride film and silicon oxide film. The film thickness of this insulating layer 67 is 120 nm, for example, but an appropriate value may be selected according to the conditions described later or the like.

However, if gate insulating layer and insulating layer 67 are both formed by the same film, setting the film thickness of insulating layer 67 is easier.

In addition, if the gate insulating layer and insulating layer 67 are of silicon oxide film, it is even more preferable since the amount of interface state between this film and the channel layer of the polycrystalline silicon can be made lower.

Moreover, since dielectric constant of the silicon oxide film is varied slightly depending on how it is manufactured, it is most preferable that the gate insulating layer and insulating layer 67 are formed by the same manufacturing method.

On this insulating layer 67, a conductive layer 1 of, for example, doped polycrystalline silicon, silicide, tungsten, aluminum or the like is formed. This conductive layer 1 is patterned by ordinary photolithography and etching, so as to be VVP layer 1 having a desired shape shown in FIG. 7.

As the material for VVP layer 1, a low-resistance material is desired. This is because VVP voltage swings between Vcc potential and GND potential depending on whether it is at a standby state or at an active state, and it is inconvenient if its charging or discharging takes time. In other words, using a low-resistance material for VVP layer 1 allows a fast operation. Thereafter, insulating layer 69 is formed, contact holes 69a, 69b are formed, and then bit lines 41a and 41b are formed so as to complete a memory cell of the SRAM which satisfies conditions of Rule 1 described later and shown in FIGS. 2A and 2B.

A method of controlling the SRAM according to the present embodiment will be described next.

Referring to FIG. 14, memory LSI 93 is selected by the circuit for selecting and deselecting the memory LSI 93 described above. More specifically, when Low is applied to $/CS_1$, each of the SRAM chips (1,0)–(1,n) is selected and is made active. As a result, VVPs within the respective memory LSIs 93 are set at GND potential.

Meanwhile, other (i≠1) memory LSIs (i, j) are deselected because $/CS_i$ is set at High, and thus is at a standby state. Accordingly, VVP within each of the deselected memory LSIs 93 is set at Vcc potential.

Based on the foregoing, VVP layer 1 shown in FIGS. 2A, 2B and 7 is set at GND (0 V) potential when active and Vcc (power supply voltage) potential during standby. The characteristics of TFT when voltage is thus applied to VVP layer 1 at active and standby states are shown in FIGS. 20 and 21, respectively.

Figure 20:
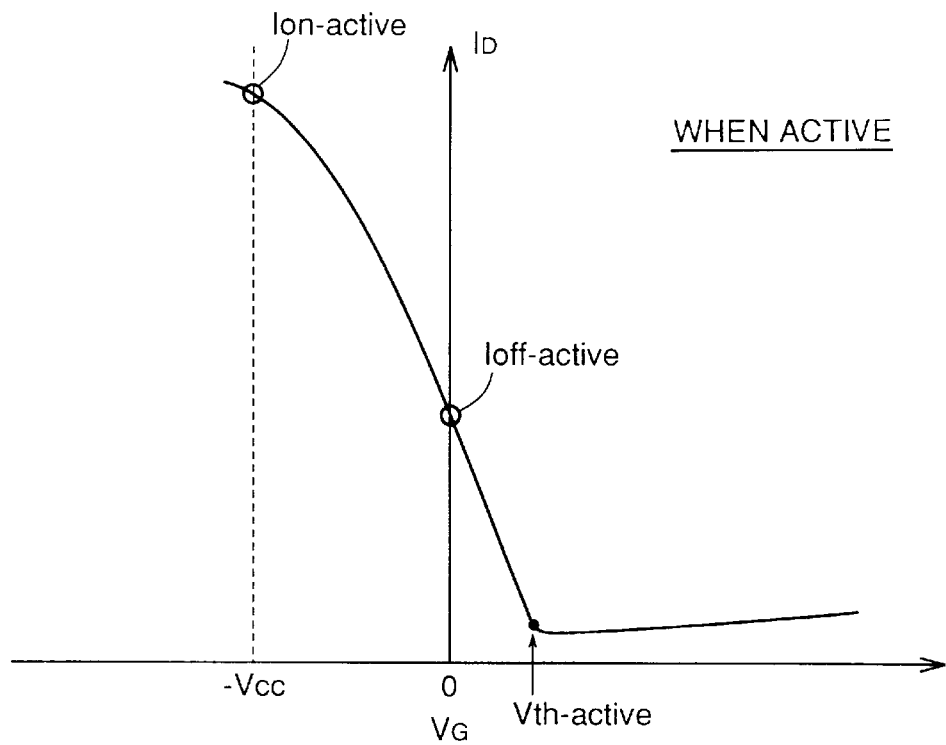
FIG. 20 is a graph showing a $V_G$–$I_D$ characteristics of the SRAM according to Embodiment 1 of the present invention when at an active state.

Referring to FIG. 20, since $V_{VVP}$=GND when active, it is like having a minus potential applied from the rear side of the channel (that is, opposite side of the gate electrode layer) for TFT, as shown in FIGS. 2A and 2B. Accordingly, the potential at the rear side of the channel is made lower and holes are more likely to be generated such that threshold voltage Vth of the TFT is reduced. Thus, it is possible to increase $I_{on\text{-}active}$.

In this case, it is natural that $I_{off\text{-}active}$ is also increased. However, this $I_{off\text{-}active}$ may be suppressed at about 1 nA since current of several tens of mA flows into the peripheral circuit when at an active state. When it is assumed that the SRAM is a 4M SRAM, the total amount of $I_{off\text{-}active}$ would be 1 nA×4M=4 mA. Accordingly, even when a 4M SRAM is manufactured, $I_{off\text{-}active}$ would be 4 mA, which is a value sufficiently small as compared to the current of several scores of mA flowing into a peripheral circuit, and thus is acceptable.

Figure 21:
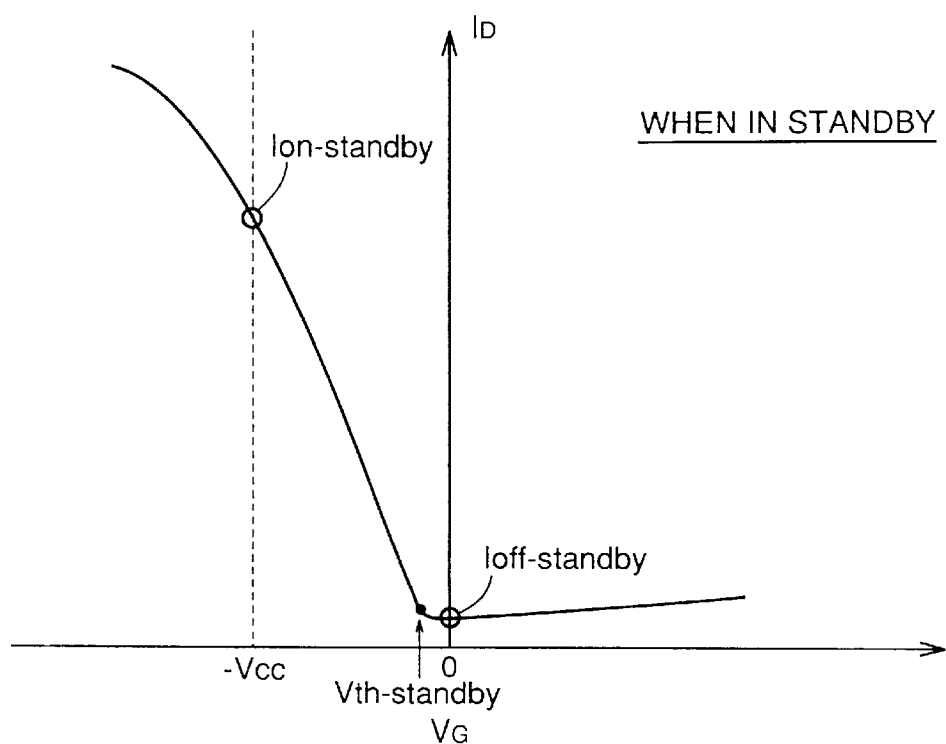
FIG. 21 is a graph showing a $V_G$–$I_D$ characteristic of the SRAM according to Embodiment 1 of the present invention during standby.

Referring to FIG. 21, since $V_{VVP}$=Vcc during standby, the voltage applied to a rear side of the channel is 0 V for a TFT. At this time, characteristics in which OFF current at the time when normal $V_G$=0 V is made small would be seen. Accordingly, OFF current can be maintained small.

Since reading/writing of the memory cell is not performed during this standby, Ion-standby does not need to be as high as $I_{on\text{-}active}$.

Based upon the foregoing, in the present embodiment, VPP layer 1 is supplied with GND potential at an active state and Vcc potential during standby, such that a high ON current can be implemented while maintaining a low OFF current.

Film thickness $t_{BOX}$ of insulating layer 67 shown in FIG. 2A will be considered next.

When voltage $V_{VPP}$ applied to VVP layer 1 is changed as described above, film thickness $t_{box}$ of insulating layer 67 must be set appropriately in order to change the characteristics of TFT as in FIGS. 20 and 21.

Threshold voltage Vth ($Vth_{\text{standby}}$) at the time of standby is determined as shown in FIG. 21. Film thickness of insulating layer 65 is defined as $t_{OX}$, film thickness of insulating layer 67 as $t_{BOX}$, film thickness of first and second semiconductor layers 13 and 15 as $t_{SOI}$, and the capacitance of these films as $C_{OX}$, $C_{BOX}$ and $C_{SOI}$. In addition, power supply voltage is defined as Vcc, and the difference between threshold voltages Vth at active state and standby state is expressed as $_\Delta$Vth (=$Vth_{\text{-active}}$−$Vth_{\text{-standby}}$). Here, if dielectric constant of silicon oxide film and silicon are respectively $\varepsilon_{OX}$, $\varepsilon_{Si}$, the respective capacitances described above will be expressed as follows.

$$C_{OX} = \frac{\varepsilon_{OX}}{t_{OX}}, \quad C_{BOX} = \frac{\varepsilon_{OX}}{t_{BOX}}, \quad C_{SOI} = \frac{\varepsilon_{Si}}{t_{SOI}}$$

If, in FIGS. 2A and 2B, a p type impurity is introduced to source/drain regions 13a, 13c, 15a, 15c of load transistors Q5, Q6 as well as to their channel regions 13b, 15b, this state of load transistor is referred to as accumulation mode (AM). In this case, $t_{BOX}$ is set so as to satisfy the expression as shown below.

$$\frac{\Delta Vth}{Vcc} = \frac{C_{BOX}}{C_{SOI}} + \frac{C_{BOX}}{C_{OX}}$$

When definition of each capacitance described above is introduced into this expression, the following expression can be obtained.

$$t_{BOX} = \frac{Vcc}{\Delta Vth}\left(\frac{\varepsilon_{OX}}{\varepsilon_{Si}} \cdot t_{SOI} + t_{OX}\right)$$

Here, if Vcc=2 V, $_\Delta$Vth=0.5 V, $t_{SOI}$=30 nm and $t_{OX}$=20 nm (where $\varepsilon_{OX}/\varepsilon_{Si}$=0.33), then $t_{BOX}$=120 nm.

Rule 2

In FIGS. 2A and 2B, if a p type impurity is introduced to source/drain regions 13a, 13c, 15a, 15c of the load transistors, an n type impurity is introduced to channel regions 13b, 15b, and in addition, if the depth to which the depletion layer is extended from the surface opposite to the gate electrode layers 11a and 11b of channel regions 13b and 15b exceeds the film thickness of channel region 13b and 15b when these load transistors are turned ON, the state of these load transistors is referred to as full depletion mode. Here, $t_{BOX}$ is set to satisfy the following expression.

$$\frac{\Delta Vth}{Vcc} = \frac{1}{\frac{C_{OX}}{C_{SOI}} + \frac{C_{OX}}{C_{BOX}}}$$

When definition of each capacitance as described above is introduced to the above expression, the result would be as follows.

$$t_{BOX} = \frac{Vcc}{\Delta Vth}t_{OX} - \frac{\varepsilon_{OX}}{\varepsilon_{Si}}t_{SOI}$$

Here, if Vcc=2 V, $_\Delta$Vth=0.5 V, $t_{SOI}$=30 nm and $t_{OX}$=20 nm, for example, then $t_{BOX}$=70 nm.

Rule 3

If a p type impurity is introduced to source/drain regions 13a, 13c, 15a, 15c of the load transistors while n type impurity is introduced to their channel regions 13b, 15b, and in addition, the depth to which a depletion layer extends from the surface opposite to gate electrode layers 11a and 11b of channel regions 13b and 15b is smaller than the film thickness of channel region 13b and 15b when this load transistor is turned ON, the state of these load transistors is referred to as partial depletion mode (PD). Here, $t_{BOX}$ is set to satisfy the following expression.

$$\Delta\frac{Vth}{Vcc} = \frac{C_{BOX}}{C_{OX}}$$

When definition for each capacitance is introduced into above expression, the result would be as follows.

$$t_{BOX} = \frac{Vcc}{\Delta Vth}t_{OX}$$

Here, if Vcc=2 V, $_\Delta$Vth=0.5 V, $t_{OX}$=20 nm and $t_{SOI}$=30 nm, then $t_{BOX}$=80 nm.

Thus, appropriate values for film thickness $t_{BOX}$ of insulating layer 67 can be obtained in each of the rules.

Trend of this film thickness $t_{BOX}$ and its margin will now be described in the following.

Figure 22:
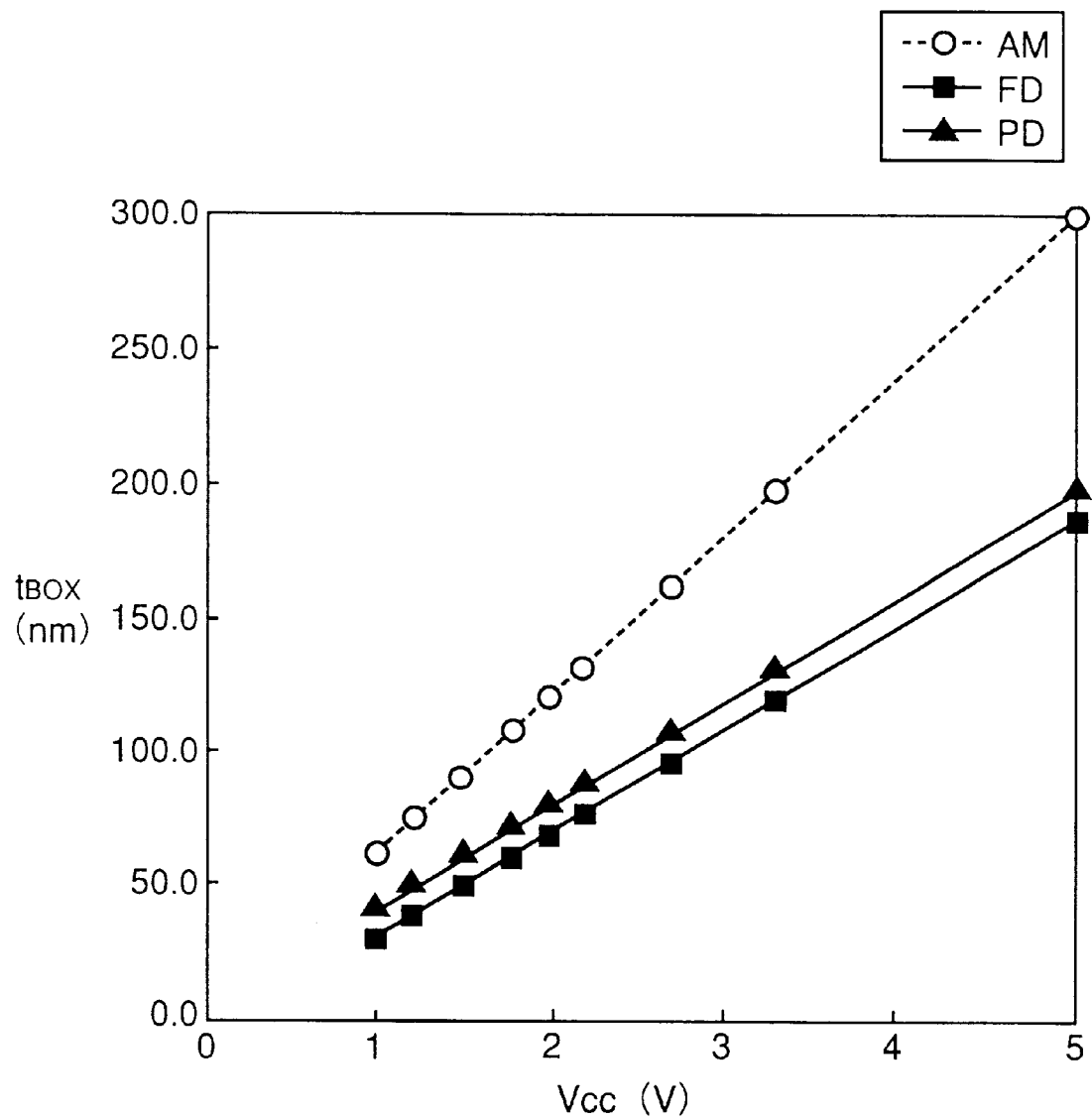
FIG. 22 is a graph showing the relationship between the power supply voltage Vcc and the film thickness $t_{BOX}$ of the insulating layer 67 in the SRAM according to Embodiment 1 of the present invention.

FIG. 22 is a graph showing the relationship between the power supply voltage and film thickness $t_{BOX}$ of insulating layer 67.

Figure 23:
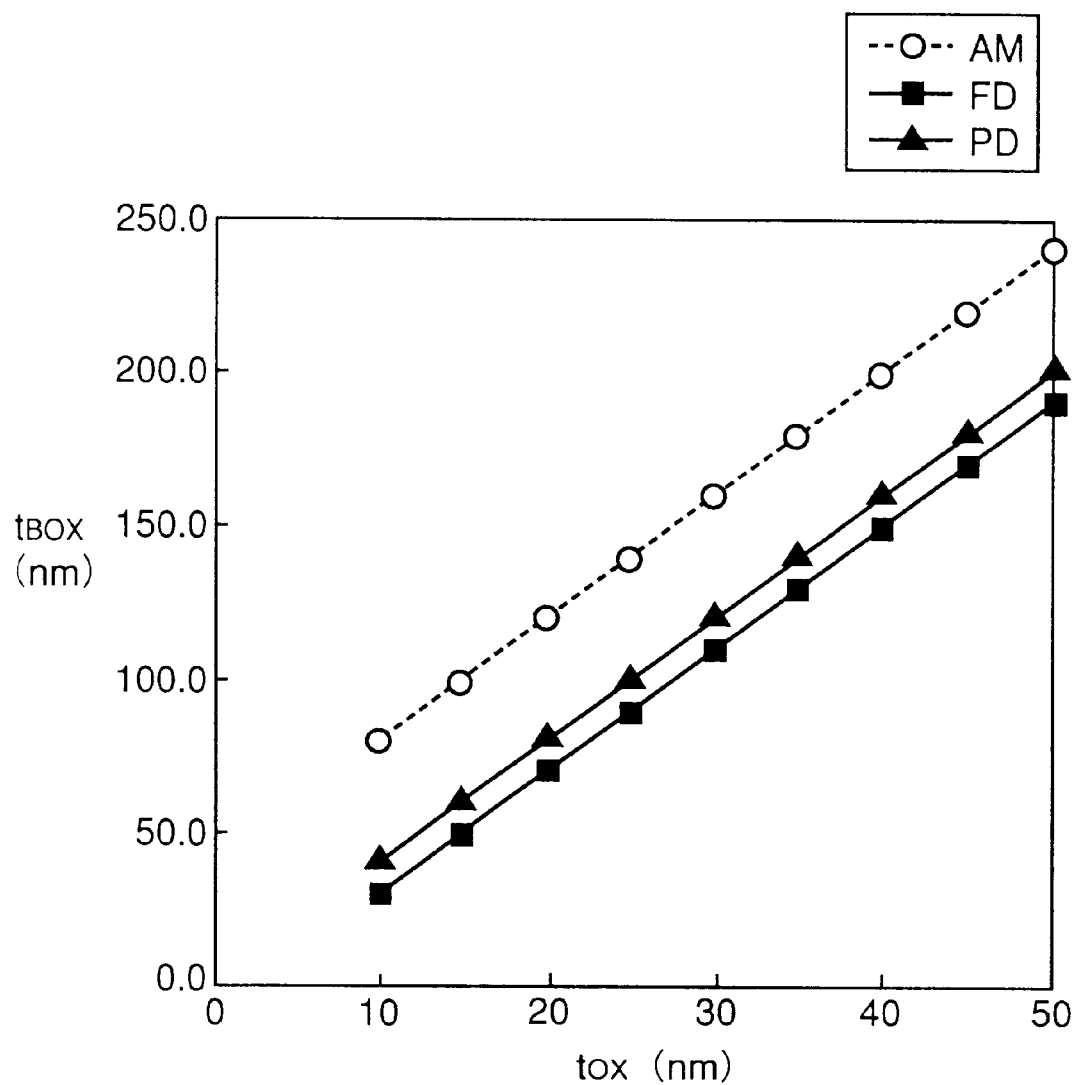
FIG. 23 is a graph showing the relationship between the film thickness $t_{OX}$ of insulating layer 65 and the film thickness $t_{BOX}$ of insulating layer 67 in the SRAM according to Embodiment 1 of the present invention.

FIG. 23 is a graph showing the relationship between film thickness $t_{OX}$ of insulating layer 65 and film thickness $t_{BOX}$ of insulating layer 67.

Figure 24:
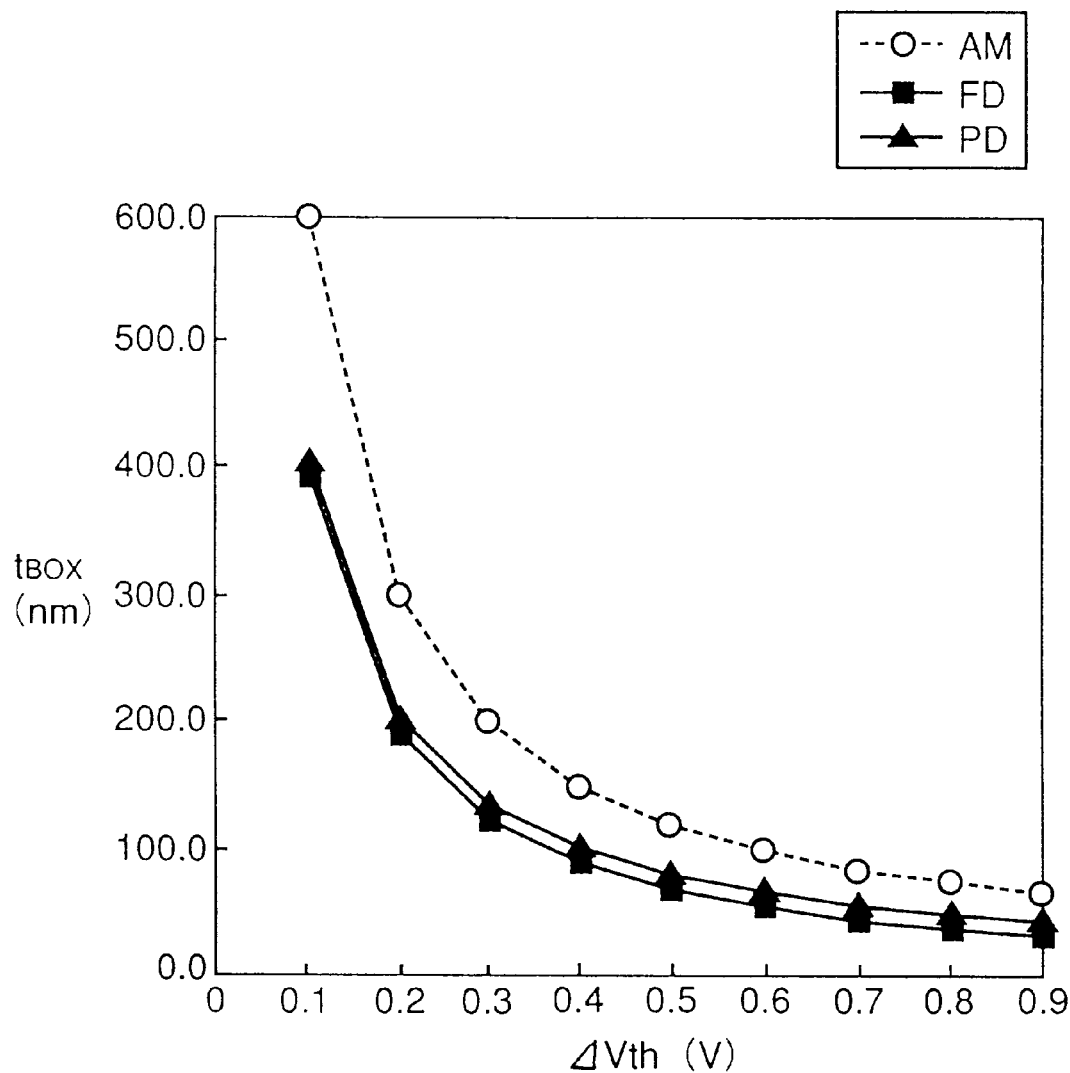
FIG. 24 is a graph showing the relationship between $_A$Vth and the film thickness $t_{BOX}$ of insulating layer 67 in the SRAM according to Embodiment 1 of the present invention.

FIG. 24 is a graph showing the relationship between difference $_\Delta$Vth of threshold voltages Vth at active state as well as standby state and film thickness $t_{BOX}$ of insulating layer 67.

Figure 25:
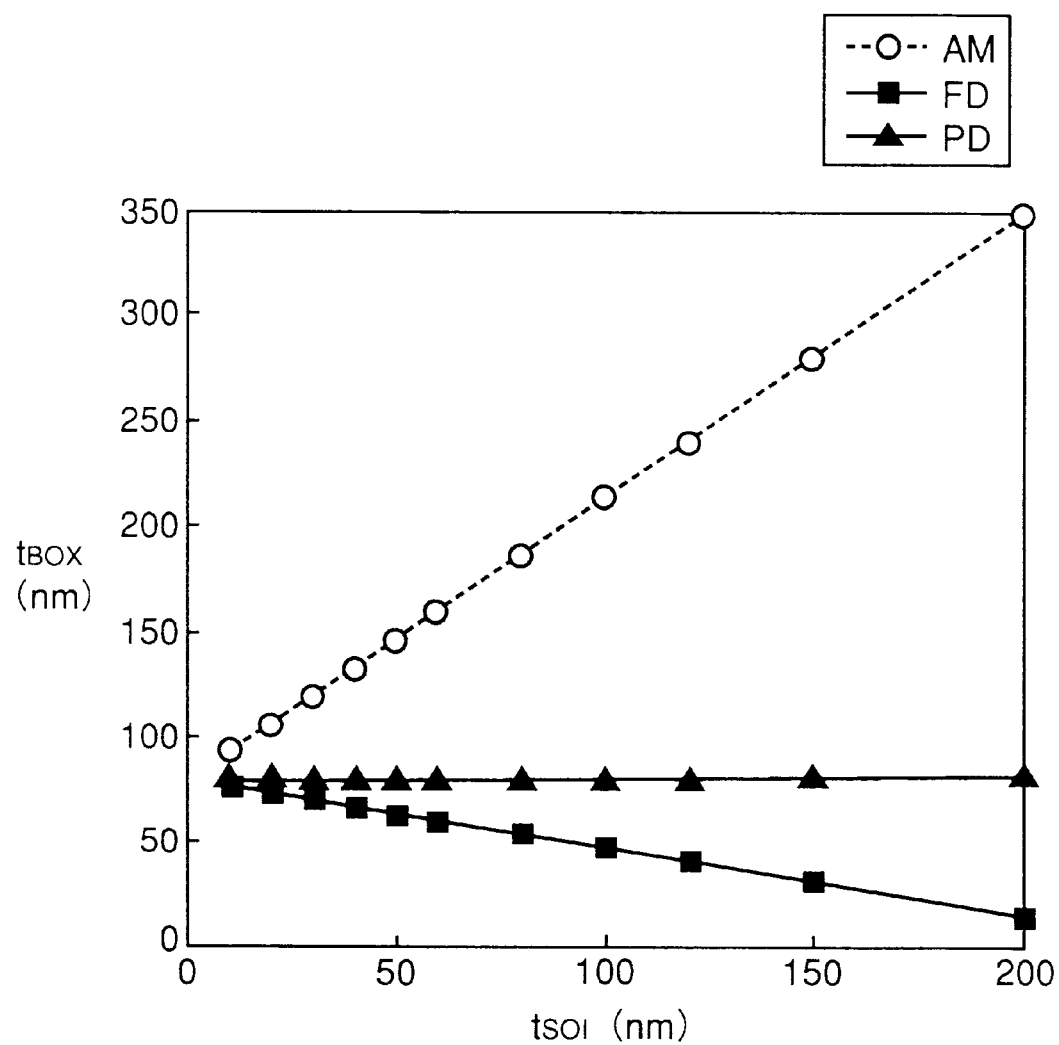
FIG. 25 is a graph showing the relationship between the film thickness $t_{SOI}$ of the first and the second semiconductor layers and the film thickness $t_{BOX}$ of the insulating layer 67 of the SRAM according to Embodiment 1 of the present invention.

FIG. 25 is a graph showing the relationship between film thickness $t_{SOI}$ of semiconductor layers 13, 15 and film thickness $t_{BOX}$ of insulating layer 67.

The graph in FIG. 22 is made on the basis of the data shown in Table 2, which has been obtained under the condition as shown in Table 1.

TABLE 1

|  | AM | FD | PD |
|---|---|---|---|
| $t_{OX}$ (nm) | 20 | 20 | 20 |
| $t_{SOI}$ (nm) | 30 | 30 | 100 |
| $_\Delta$Vth (V) | 0.5 | 0.5 | 0.5 |

TABLE 2

| | $t_{BOX}$ (nm) | | |
|---|---|---|---|
| Vcc (V) | AM | FD | PD |
| 5 | 300.0 | 190.0 | 200.0 |
| 3.3 | 198.0 | 122.0 | 132.0 |
| 2.7 | 162.0 | 98.0 | 108.0 |
| 2.2 | 132.0 | 78.0 | 88.0 |
| 2 | 120.0 | 70.0 | 80.0 |
| 1.8 | 108.0 | 62.0 | 72.0 |
| 1.5 | 90.0 | 50.0 | 60.0 |
| 1.2 | 72.0 | 38.0 | 48.0 |
| 1 | 60.0 | 30.0 | 40.0 |

In addition, the graph of FIG. 23 is made on the basis of the data shown in Table 4 obtained under the conditions shown in Table 3.

TABLE 3

|  | AM | FD | PD |
|---|---|---|---|
| Vcc (V) | 2 | 2 | 2 |
| $t_{SOI}$ (nm) | 30 | 30 | 100 |
| $_\Delta$Vth (V) | 0.5 | 0.5 | 0.5 |

TABLE 4

| | $t_{BOX}$ (nm) | | |
|---|---|---|---|
| $t_{OX}$ (nm) | AM | FD | PD |
| 10 | 80.0 | 30.0 | 40.0 |
| 15 | 100.0 | 50.0 | 60.0 |
| 20 | 120.0 | 70.0 | 80.0 |
| 25 | 140.0 | 90.0 | 100.0 |
| 30 | 160.0 | 110.0 | 120.0 |
| 35 | 180.0 | 130.0 | 140.0 |
| 40 | 200.0 | 150.0 | 160.0 |
| 45 | 220.0 | 170.0 | 180.0 |
| 50 | 240.0 | 190.0 | 200.0 |

The graph of FIG. 24 is made on the basis of the data shown in Table 6 obtained under the condition shown in Table 5.

TABLE 5

|  | AM | FD | PD |
|---|---|---|---|
| Vcc (V) | 2 | 2 | 2 |
| $t_{SOI}$ (nm) | 30 | 30 | 100 |
| $t_{OX}$ (nm) | 20 | 20 | 20 |

TABLE 6

| | $t_{BOX}$ (nm) | | |
|---|---|---|---|
| $_\Delta$Vth (nm) | AM | FD | PD |
| 0.1 | 600.0 | 390.0 | 400.0 |
| 0.2 | 300.0 | 190.0 | 200.0 |
| 0.3 | 200.0 | 123.3 | 133.3 |
| 0.4 | 150.0 | 90.0 | 100.0 |
| 0.5 | 120.0 | 70.0 | 80.0 |
| 0.6 | 100.0 | 56.7 | 66.7 |
| 0.7 | 85.7 | 47.1 | 57.1 |
| 0.8 | 75.0 | 40.0 | 50.0 |
| 0.9 | 66.7 | 34.4 | 44.4 |

The graph of FIG. 25 is made on the basis of the data shown in Table 8 obtained under the condition shown in Table 7.

TABLE 7

|  | AM | FD | PD |
|---|---|---|---|
| Vcc (V) | 2 | 2 | 2 |
| $_\Delta$Vth (V) | 0.5 | 0.5 | 0.5 |
| $t_{OX}$ (nm) | 20 | 20 | 20 |

TABLE 8

| | $t_{BOX}$ (nm) | | |
|---|---|---|---|
| $t_{SOI}$ (nm) | AM | FD | PD |
| 10 | 93.3 | 76.7 | 80.0 |
| 20 | 106.7 | 73.3 | 80.0 |
| 30 | 120.0 | 70.0 | 80.0 |
| 40 | 133.3 | 66.7 | 80.0 |
| 50 | 146.7 | 63.3 | 80.0 |
| 60 | 160.0 | 60.0 | 80.0 |
| 80 | 186.7 | 53.3 | 80.0 |
| 100 | 213.3 | 46.7 | 80.0 |
| 120 | 240.0 | 40.0 | 80.0 |
| 150 | 280.0 | 30.0 | 80.0 |
| 200 | 346.7 | 13.3 | 80.0 |

The following Table 9 shows the range of film thickness $t_{BOX}$ of insulating layer 67 under each condition.

TABLE 9

| | $t_{BOX}$ (nm) | | |
|---|---|---|---|
| Conditions | Rule 1 AM | Rule 2 FD | Rule 3 PD |
| Vcc = 5.0V<br>S = 300mv/dec<br>$_\Delta$Vth = 1.2V<br>$t_{OX}$ = 30nm<br>$t_{SOI}$ = 100nm | 216–323 | 66–123 | 102–153 |
| Vcc = 3.3V<br>S = 200mv/dec<br>$_\Delta$Vth = 0.8V<br>$t_{OX}$ = 25nm | 174–260 | 55–102 | 84–126 |

TABLE 9-continued

| Conditions | $t_{BOX}$ (nm) | | |
|---|---|---|---|
| | Rule 1 AM | Rule 2 FD | Rule 3 PD |
| $t_{SOI}$ = 80nm<br>Vcc = 2.5V<br>S = 150mv/dec<br>$_\Delta$Vth = 0.6V<br>$t_{OX}$ = 22nm | 132–197 | 57–97 | 75–112 |
| $t_{SOI}$ = 50nm<br>Vcc = 2.0V<br>S = 125mv/dec<br>$_\Delta$Vth = 0.5V<br>$t_{OX}$ = 20nm | 98–147 | 54–89 | 65–98 |
| $t_{SOI}$ = 30nm<br>Vcc = 1.5V<br>S = 100mv/dec<br>$_\Delta$Vth = 0.4V<br>$t_{OX}$ = 15nm<br>$t_{SOI}$ = 20nm | 66–99 | 39–63 | 46–69 |
| Sum | 66–323 | 39–123 | 46–153 |
| Total | | 39–323 | |

Figure 26:
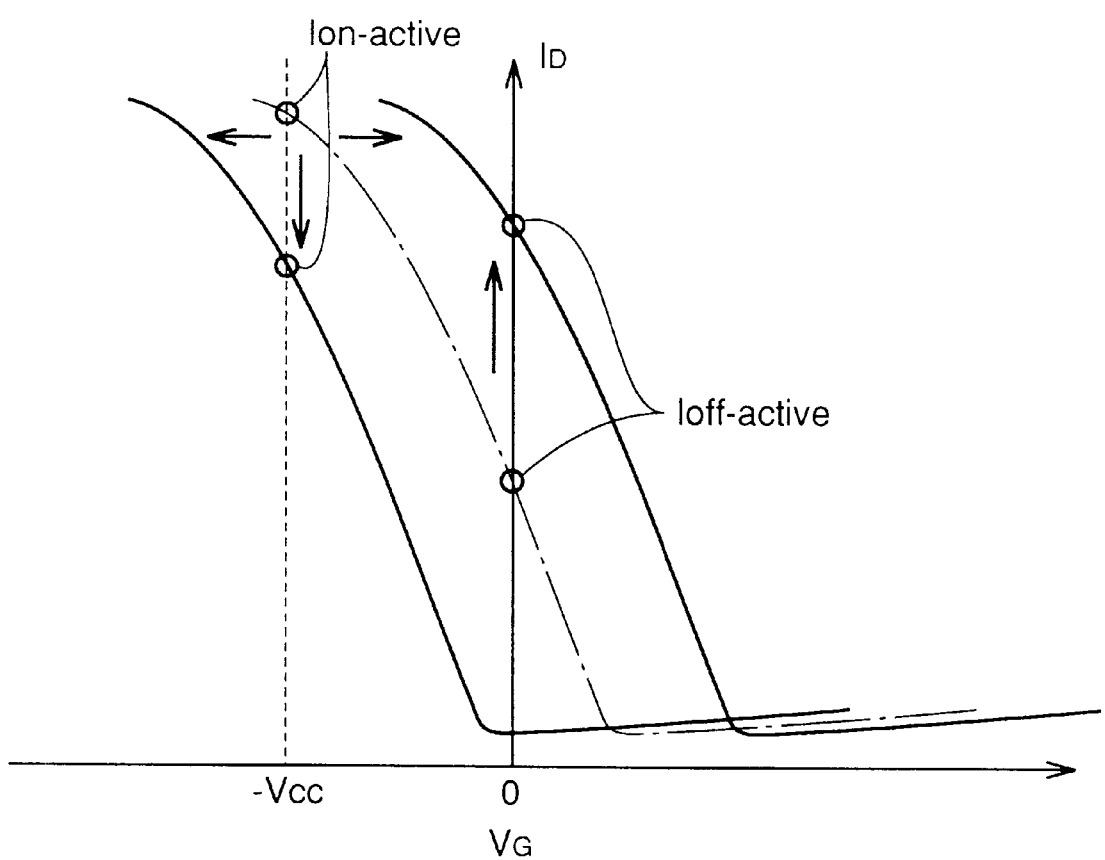
FIG. 26 is a graph showing the $V_G$–$I_D$ characteristics for describing the problems which occur when the film thickness of the insulating layer 67 is offset from the range of film thickness.

As shown in FIG. 26, when film thickness $t_{BOX}$ is smaller than the lower limit of the range of film thickness shown above, the $I_D$-$V_G$ curve would shift to the right hand side of the figure and the value of $I_{off\text{-}active}$ is raised significantly, thus increasing the power consumption. Meanwhile, when film thickness $t_{BOX}$ is larger than the upper limit of the range of film thickness, $I_D$-$V_G$ curve shown in FIG. 26 would shift to the left hand side of the figure and $I_{on\text{-}active}$ is lowered significantly, and stable operation of TFT cannot be obtained.

Accordingly, when p channel TFTs are employed as load transistors Q5 and Q6, film thickness of insulating layer 67 would be 39 nm–323 nm.

In addition, when load transistors Q5 and Q6 are in an accumulation mode (AM) of p channel TFT, the film thickness of insulating layer 67 would be 66 nm–323 nm.

When load transistors Q5 and Q6 are in an full depletion mode (FD) of p channel TFT, the film thickness of insulating layer 67 would be 39 nm–123 nm.

When load transistors Q5 and Q6 are in a partial depletion mode (PD) of p channel TFT, the film thickness of insulating layer 67 would be 46 nm–153 nm.

AM, FD and PD in FIGS. 22 to 25 as well as Tables 1 to 9 correspond to accumulation mode, full depletion mode and partial depletion mode, respectively.

As for film thicknesses $t_{OX}$ and $t_{BOX}$ when insulating layers 65 and 67 are films other than silicon oxide film or composite film including silicon oxide film and other film, the value of the film thicknesses may be obtained by considering the dielectric constants of these films and applying them to the film thickness of a silicon oxide film.

Embodiment 2

Figure 27A:
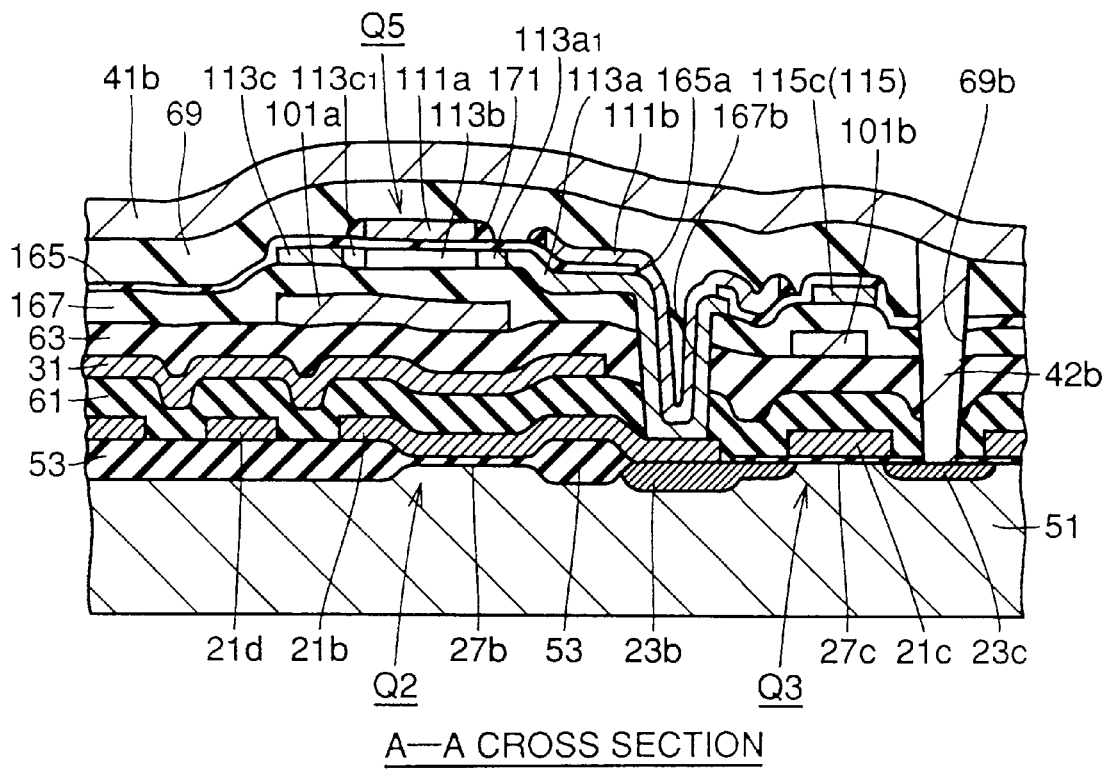
FIGS. 27A and 27B are schematic cross sectional views showing a memory cell structure of an SRAM according to Embodiment 2 of the present invention, taken along lines A—A and B—B in FIGS. 28 to 31, respectively.
Figure 27B:
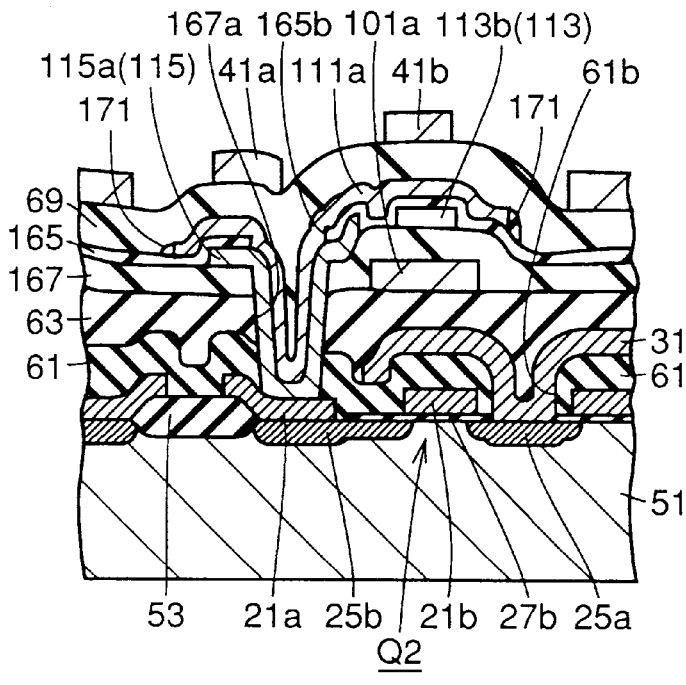

FIGS. 27A and 27B corresponds to cross sections taken along lines A—A and B—B in FIGS. 28 to 31, respectively.

The memory cell structure of the SRAM according to the present embodiment differs from Embodiment 1 in the configuration of VVP layer and load transistor. In particular, the load transistor is a TFT of a top gate type having an LDD (Lightly Doped Drain) structure.

A pair of driver transistors Q1 and Q2, a pair of access transistors Q3 and Q4, and a conductive layer 31 for ground are of a structure substantially similar to that of FIGS. 3 and 4 described above.

Figure 28:
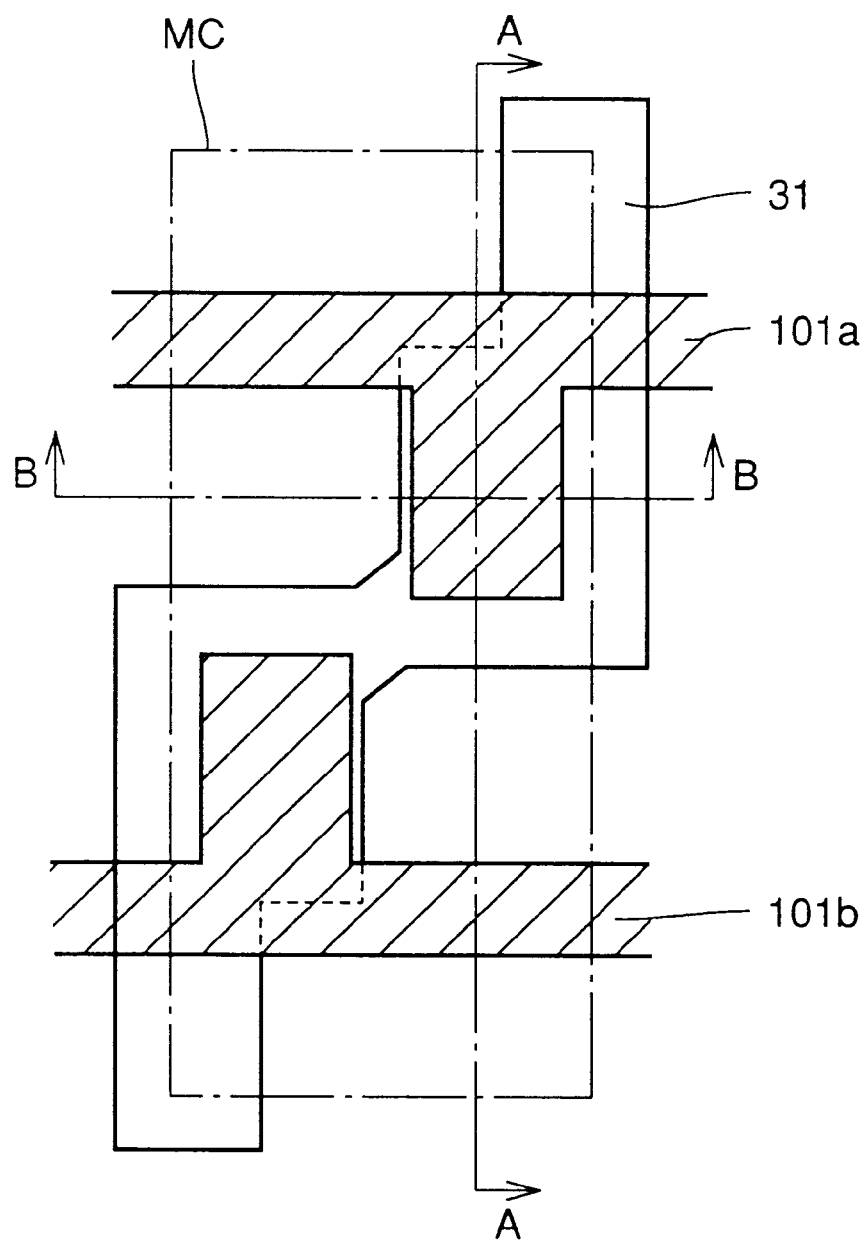
FIGS. 28 to 31 are plan views showing the structure of the memory cell of the SRAM according to Embodiment 2 of the present invention successively from the lower layer to the upper layer.

Referring mainly to FIGS. 27A, 27B and 28, an insulating layer 63 is formed to cover conductive layer 31 for ground. On this insulating layer 63, VVP layers 101a and 101b are formed to be separated from each other in a memory cell region MC and to cross memory cell region MC laterally in FIG. 28. These VVP layers 101a and 101b are formed such that GND potential is applied at an active state and Vcc potential is applied during standby.

Figure 29:
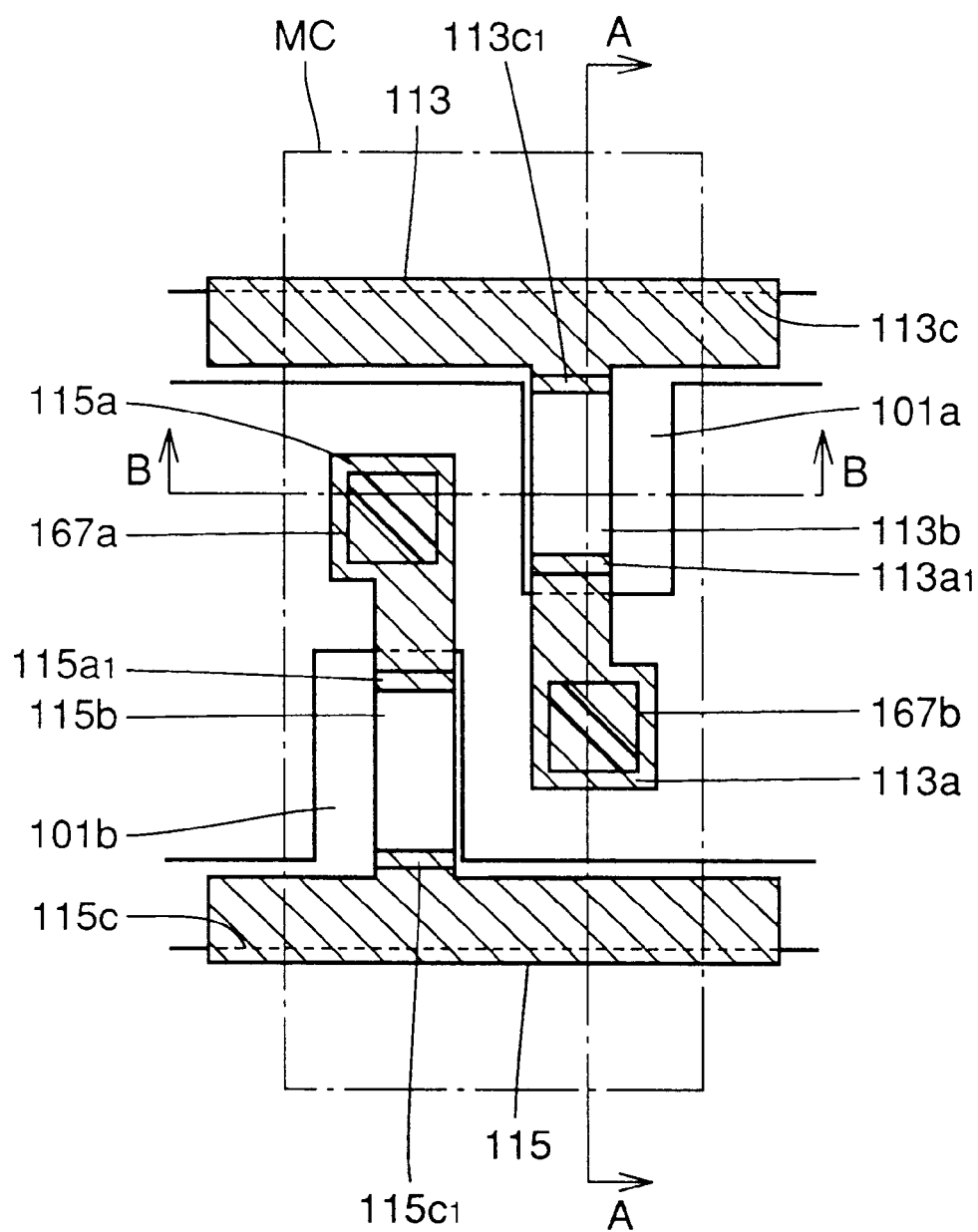

Referring mainly to FIGS. 27A, 27B and 29, an insulating layer 167 is formed to cover these VVP layers 101a and 101b. At this insulating layer 167 and insulating layers 63, 61, contact holes 167a and 167b penetrating these insulating layers are formed. A first semiconductor layer 113 is formed to be connected electrically to gate electrode layer 21b of driver transistor Q2 through this contact hole 167b. A second semiconductor layer 115 is formed to be connected electrically to gate electrode layer 21a of driver transistor Q1 through contact hole 167a.

A pair of source/drain regions are formed at the first semiconductor layer 113 with a prescribed distance therebetween so as to define a channel region 113b. This pair of source/drain regions have an LDD structure and is formed of a two-layered structure including impurity regions $113a_1$, $113c_1$ with a relatively low impurity concentration and impurity regions 113a, 113c with a relatively high impurity concentration. Channel region 113b is provided to be opposite to at least VVP layer 101a.

A pair of source/drain regions are formed at second semiconductor layer 115 spaced apart from each other by a prescribed distance so as to define a channel region 115b. This pair of source/drain regions have the LDD structure and is formed of a two-layered structure including impurity regions $115a_1$, $115c_1$ with a relatively low impurity concentration and impurity regions 115a, 115c with a relatively high impurity concentration. Channel region 115b is provided to be opposite to at least VPP layer 101b.

These source/drain regions 113c and 115c of first and second semiconductor layers 113 and 115 are connected electrically to power supply potential line. First and second semiconductor layers 113 and 115 are formed of, for example, polycrystalline silicon.

Figure 30:
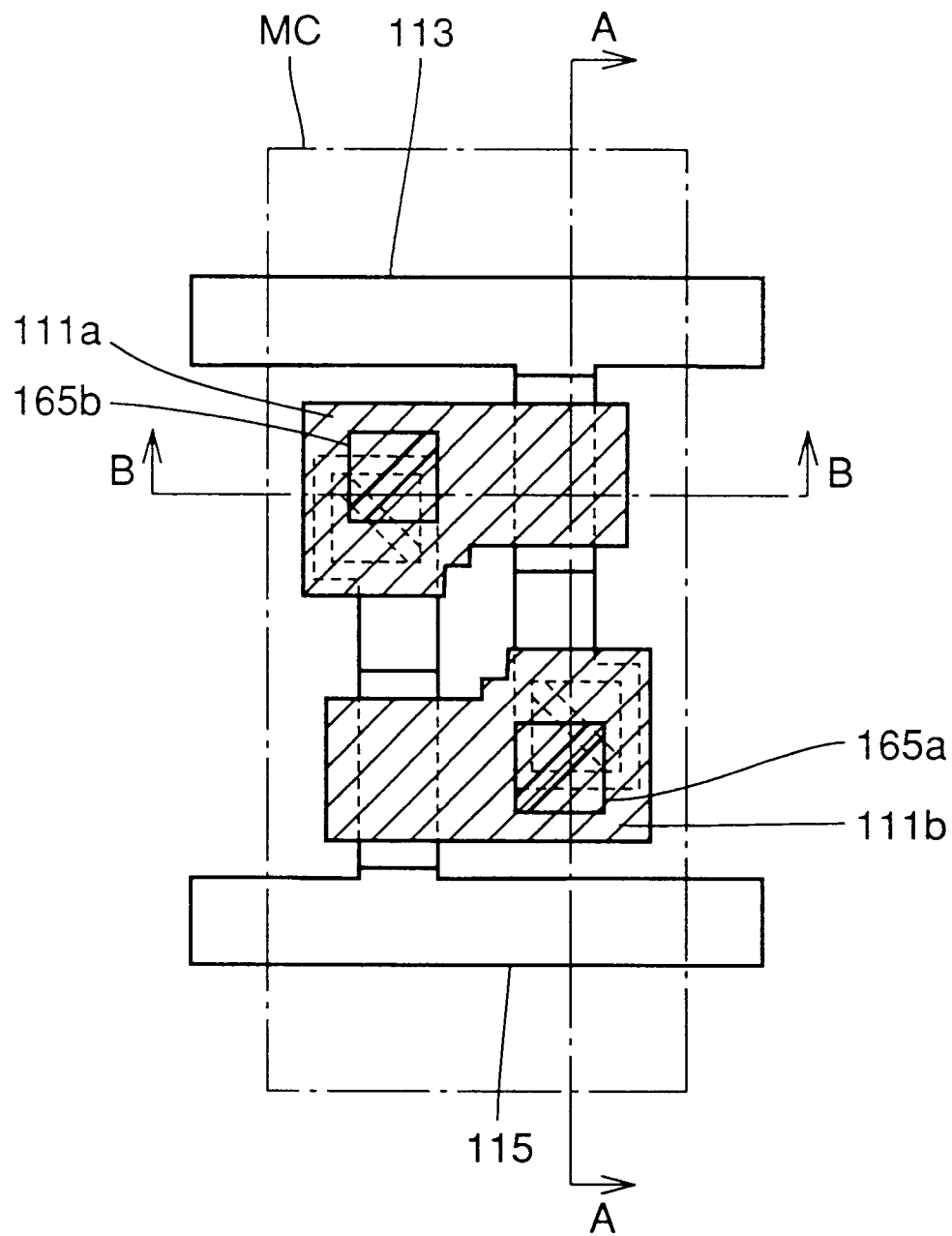

Referring mainly to FIGS. 27A, 27B and 30, an insulating layer 165 of, for example, silicon oxide film is formed to cover first and second semiconductor layers 113 and 115. At this insulating layer 165, openings 165a and 165b are formed to expose portions of surfaces of first and second semiconductor layers 113 and 115.

A gate electrode layer 111b is formed on insulating layer 165 so as to be electrically connected to first semiconductor layer 113 through this opening 165a. This electrode layer 111b is formed to be opposite to channel region 115b formed at the second semiconductor layer 115.

A gate electrode layer 111a is formed on insulating layer 165 so as to be connected electrically to second semiconductor layer 115 through opening 165b. This gate electrode layer 111a is formed to be opposite to channel region 113b formed at first semiconductor layer 113.

These gate electrode layers 111a and 111b are electrically insulated from one another. At the sidewalls of gate electrode layers 111a and 111b, side wall insulating layers 171 are formed.

Figure 31:
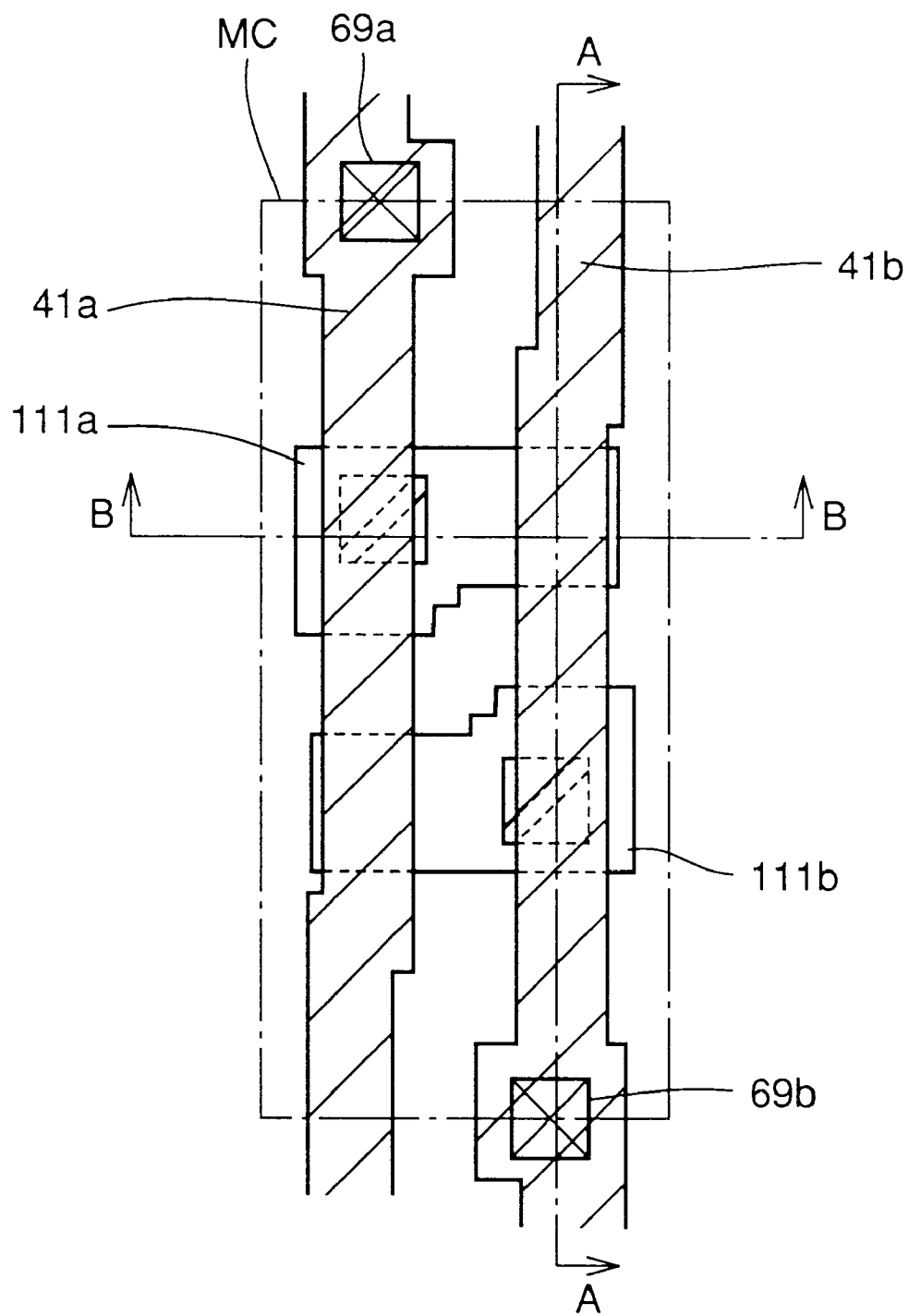

Referring mainly to FIGS. 27A, 27B and 31, an insulating layer 69 is formed to cover gate electrode layers 111a and 111b. At insulating layers 69, 165, 167, 63, 61 and so on, contact holes 69a and 69b are formed, penetrating theses layers. A bit line 41a is formed on insulating layer 69 so as to be connected electrically to source/drain region 25c of access transistor Q4 through this contact hole 69a. A bit line 41b is formed on insulating layer 69 so as to be connected electrically to source/drain region 23c of access transistor Q3 through contact hole 69b. These bit lines 41a and 41b are formed to be separated from each other in memory cell region MC, and to cross memory cell regions MC vertically in FIG. 31.

Since other portions of the structure are substantially similar to those of Embodiment 1, the same members are denoted by the same reference characters and description thereof is not given.

A method of manufacturing the memory cell structure of SRAM according to the present embodiment will now be described.

The steps of forming a pair of driver transistors Q1 and Q2, a pair of access transistors Q3 and Q4, and conductive layers 31 for ground on semiconductor substrate 51 are substantially similar to those of Embodiment 1, and thus description thereof is not given.

Figure 32A:
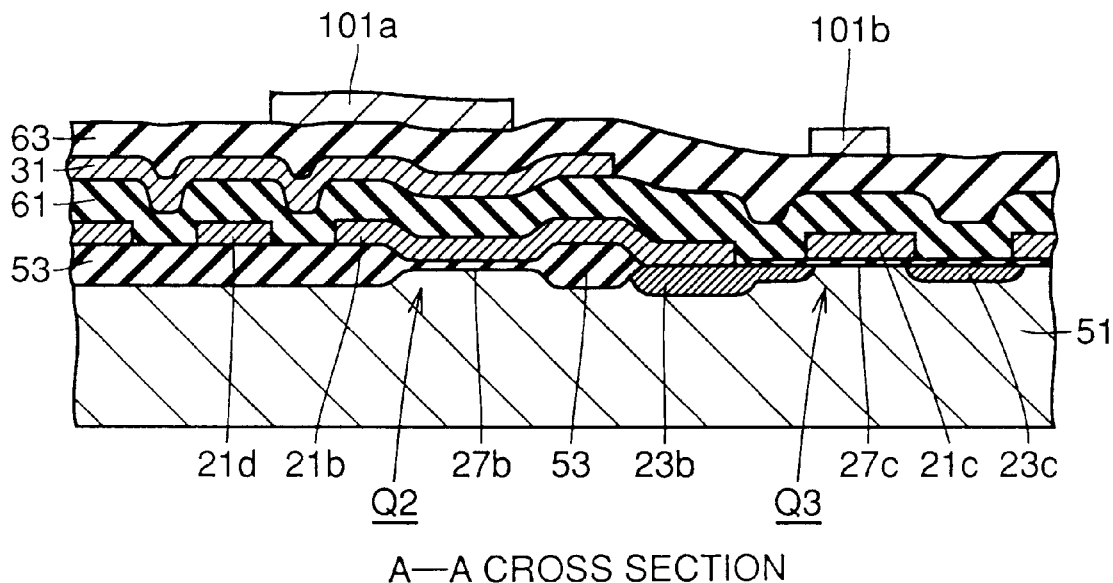
FIGS. 32A and 32B are schematic cross sectional views corresponding to FIGS. 27A and 27B, showing a first step in a manufacturing method of the memory cell structure in the SRAM according to Embodiment 2 of the present invention.
Figure 32B:
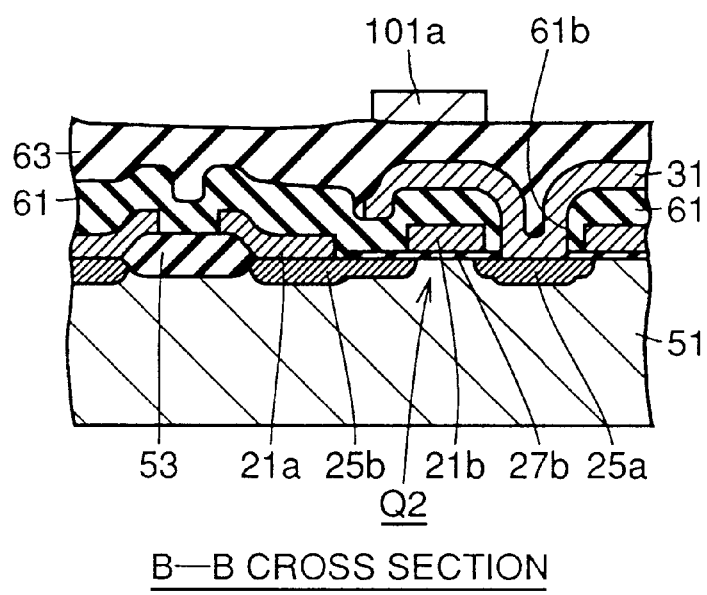

Referring to FIGS. 32A and 32B, VVP layers 101a and 101b are formed on insulating layer 63 to obtain a desired shape as shown in FIG. 28. Since it is desirable that these VVP layers 101a and 101b are manufactured from a low resistance material, employment of metal such as aluminum is preferred. However, if metal such as aluminum is used for these VVP layers 101a and 101b, heat treatment of 500° C. cannot be employed in the later process. Accordingly, metals such as aluminum cannot be employed.

Thus, it would be effective to use tungsten silicide film or the like for VVP layers 101a and 101b. In addition, a two layered film of silicide and polycrystalline silicon may be used for VVP layers 101a and 101b, in which case it is preferred that the polycrystalline silicon is arranged above the silicide. This is based on the fact that the electric characteristics of the TFT are degraded when silicide is brought into direct contact with the gate insulating film and to produce an interface state.

Figure 33A:
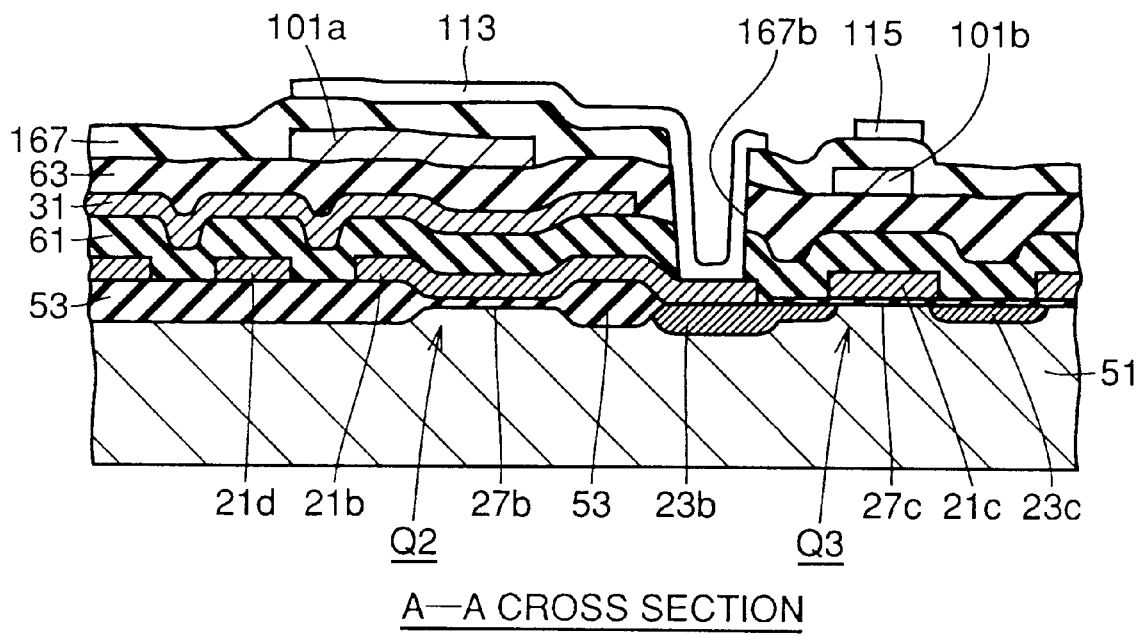
FIGS. 33A and 33B are schematic cross sectional views corresponding to FIGS. 27A and 27B, showing a second step in the manufacturing method of the memory cell structure in the SRAM according to Embodiment 2 of the present invention.
Figure 33B:
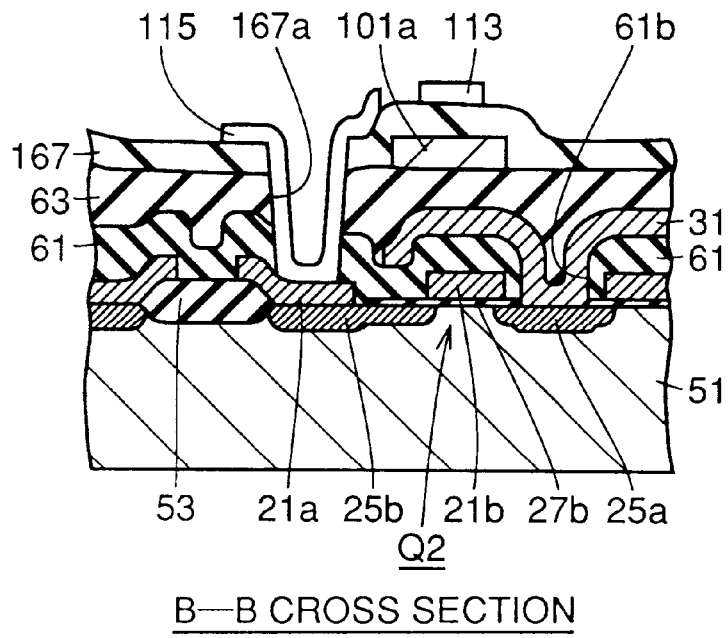

Referring to FIGS. 33A and 33B, an insulating layer is formed to cover VVP layers 101a and 101b. At insulating layers 167, 63 and 61, contact holes 167a and 167b are formed to penetrate these layers. A semiconductor layer is formed entirely on the surface of the substrate so as to be in contact with gate electrode layer 21a of driver transistor Q1 through this contact hole 167a and to be in contact with gate electrode layer 21b of driver transistor Q2 through contact hole 167b. This semiconductor layer is of, for example, polycrystalline silicon.

Channel implantation is performed to this semiconductor layer. This channel implantation is performed by ion implantation of $BF_2$, for example, with a implanting energy of 30 keV and dose of $1\times10^{12}/cm^2$. Accordingly, threshold voltage Vth of load transistors Q5 and Q6 during standby is determined. Thereafter, first and second semiconductor layers 113 and 115 having a desired shape as shown in FIG. 29 is formed by ordinary photolithography and etching.

Figure 34A:
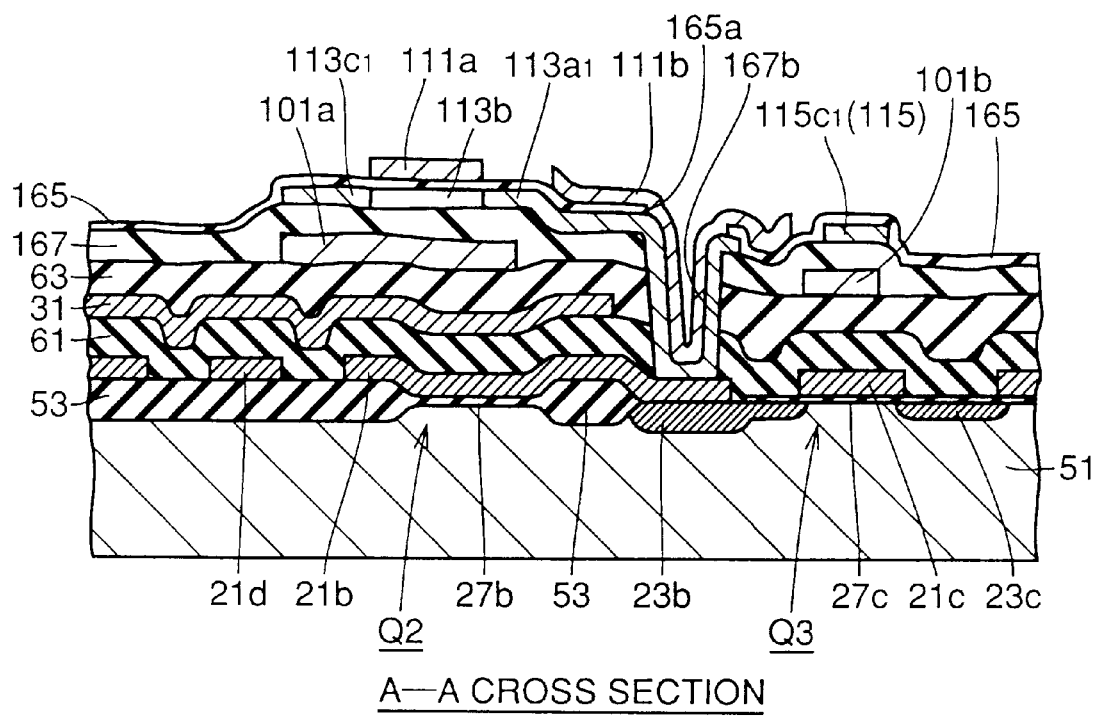
FIGS. 34A and 34B are schematic cross sectional views corresponding to FIGS. 27A and 27B, showing a third step in the manufacturing method of the memory cell structure of the SRAM according to Embodiment 2 of the present invention.
Figure 34B:
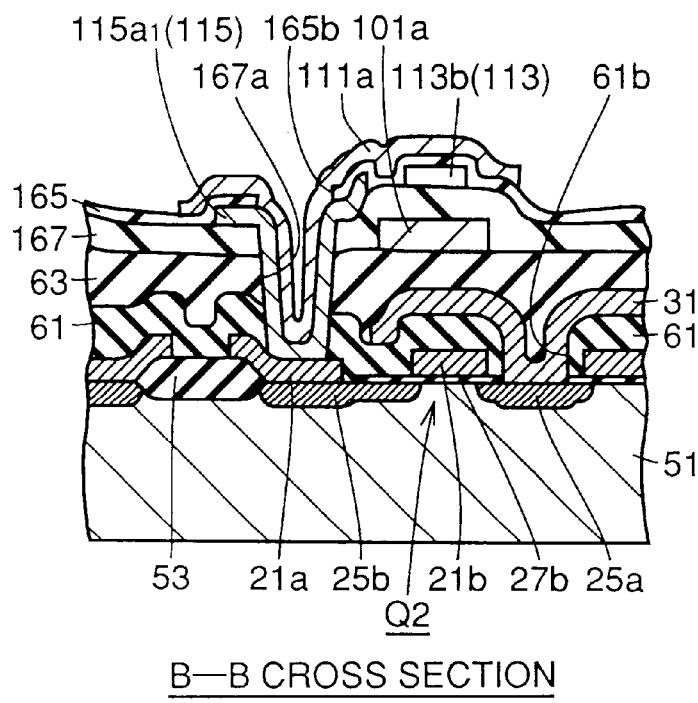

Referring to FIGS. 34A and 34B, an insulating layer 165 of, for example, silicon oxide film is formed to cover first and second semiconductor layers 113 and 115. At this insulating layer 165, openings 165a and 165b are formed to expose porions of surfaces of first and second semiconductor layers 113 and 115 by ordinary photolithography and etching.

A gate electrode layer 111b is formed to be connected electrically to first semiconductor layer 113 through this opening 165a and gate electrode layer 111a is formed to be connected electrically to second semiconductor layer 115 through opening 165b, each having a desired shape as shown in FIG. 30. These gate electrode layers 111a and 111b are formed of, for example, doped polycrystalline silicon.

Thereafter, ions of p type impurity are implanted to first and second semiconductor layers. In this way, impurity regions $113a_1$, $113c_1$ $115a_1$ $115c_1$ having a relatively low impurity concentration are formed at first and second semiconductor layers to define the channel region.

Figure 35A:
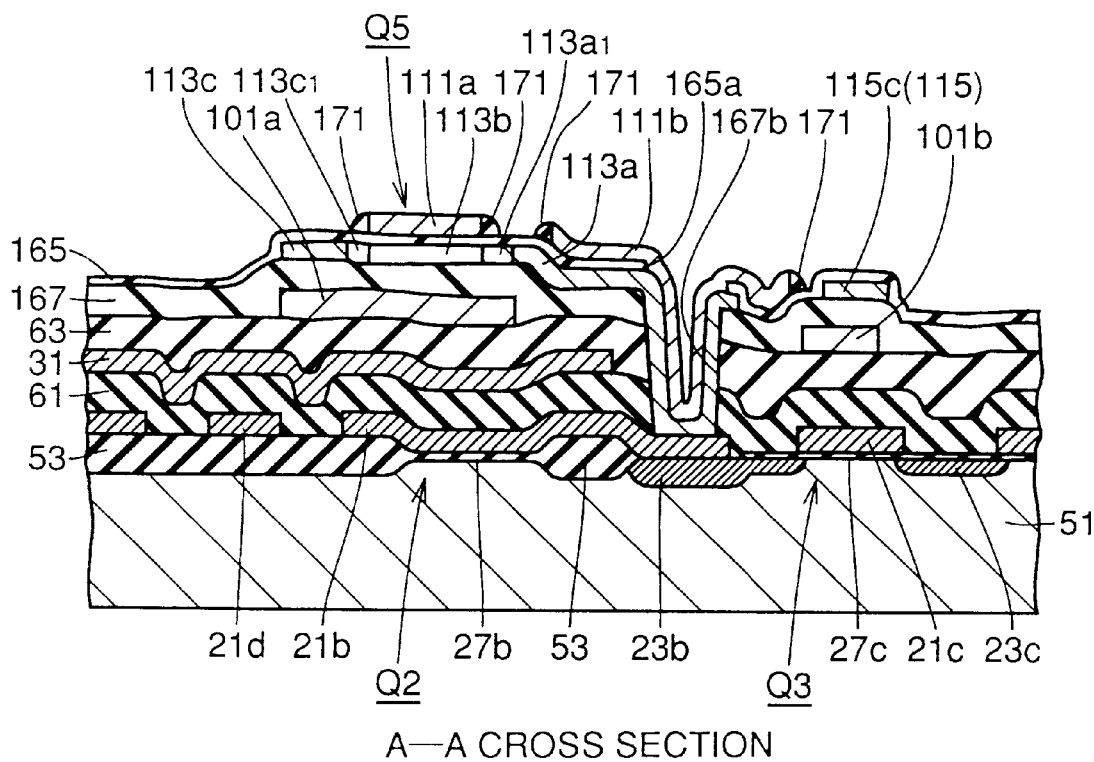
FIGS. 35A and 35B are schematic cross sectional views corresponding to FIGS. 27A and 27B, showing a fourth step in the manufacturing method of the memory cell structure of the SRAM according to Embodiment 2 of the present invention.
Figure 35B:
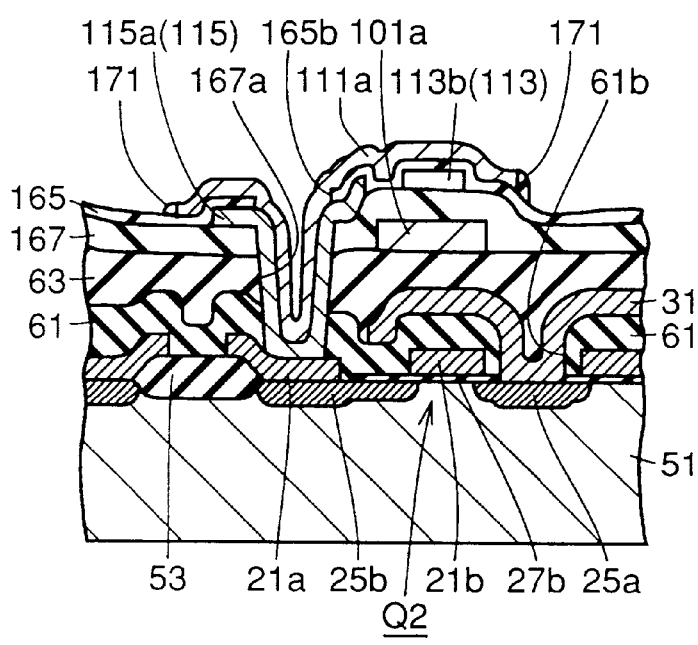

Referring FIGS. 35A and 35B, a sidewall insulating layer 171 is formed at the sidewall of gate electrode layers 111a and 111b by, for example, silicon oxide film. Thereafter, ions of p type impurity are implanted again. As a result, impurity regions 113a, 113c, 115a and 115c having a relatively high impurity concentration are formed at first and second semiconductor layers. Accordingly, a TFT of an LDD structure formed of two layers including regions $113a_1$, $113c_1$, $115a_1$ and $115c_1$ with a relatively low impurity concentration and regions 113a, 113c, 115a and 115c with a relatively high impurity concentration can be obtained.

Thereafter, by forming insulating layer 69 and as well as contact holes 69a and 69b, bit lines 41a and 41b, the SRAM memory cell according to the present embodiment shown in FIG. 27 is completed.

By a structure similar to that of Embodiment 1, VVP layers 101a and 101b shown in FIG. 27 are supplied with GND potential when at an active state and Vcc potential during standby also in the memory cell structure of the SRAM according to the present embodiment. Thus, ON current can be improved while maintaining small OFF current as in the case of Embodiment 1.

In addition, film thickness $t_{BOX}$ of insulating layer 167 may be set similarly to that of Embodiment 1.

Other Embodiments

Figure 36:
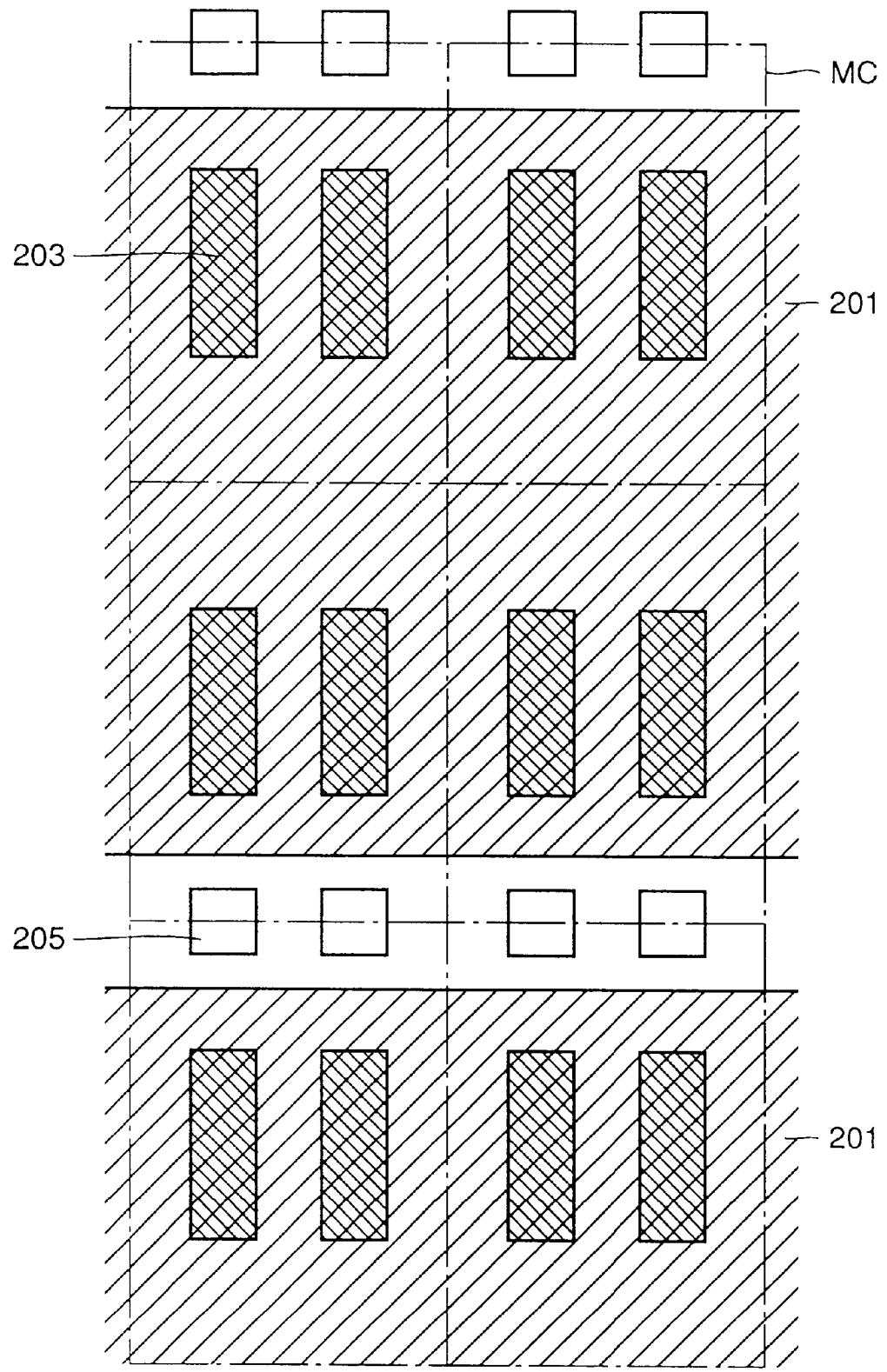
FIG. 36 is a schematic plan view showing a memory cell structure of the SRAM including 6 bits according to another embodiment of the present invention.

Referring to FIG. 36, if VVP layer 201 is to be provide opposite to channel region 203 of a load transistor, the structure may not be limited to that of Embodiments 1 and 2. VVP layer 201 may be provided to extend laterally in the figure to be laid across a memory cell including 2 bits. In this case, contact portion 205 of the bit line would be arranged at every 2 bits in a vertical direction of the figure. Since VVP layer 201 may thus be formed such that only the portion of bit line contact is opened, its pattern can be made very large.

Figure 37:
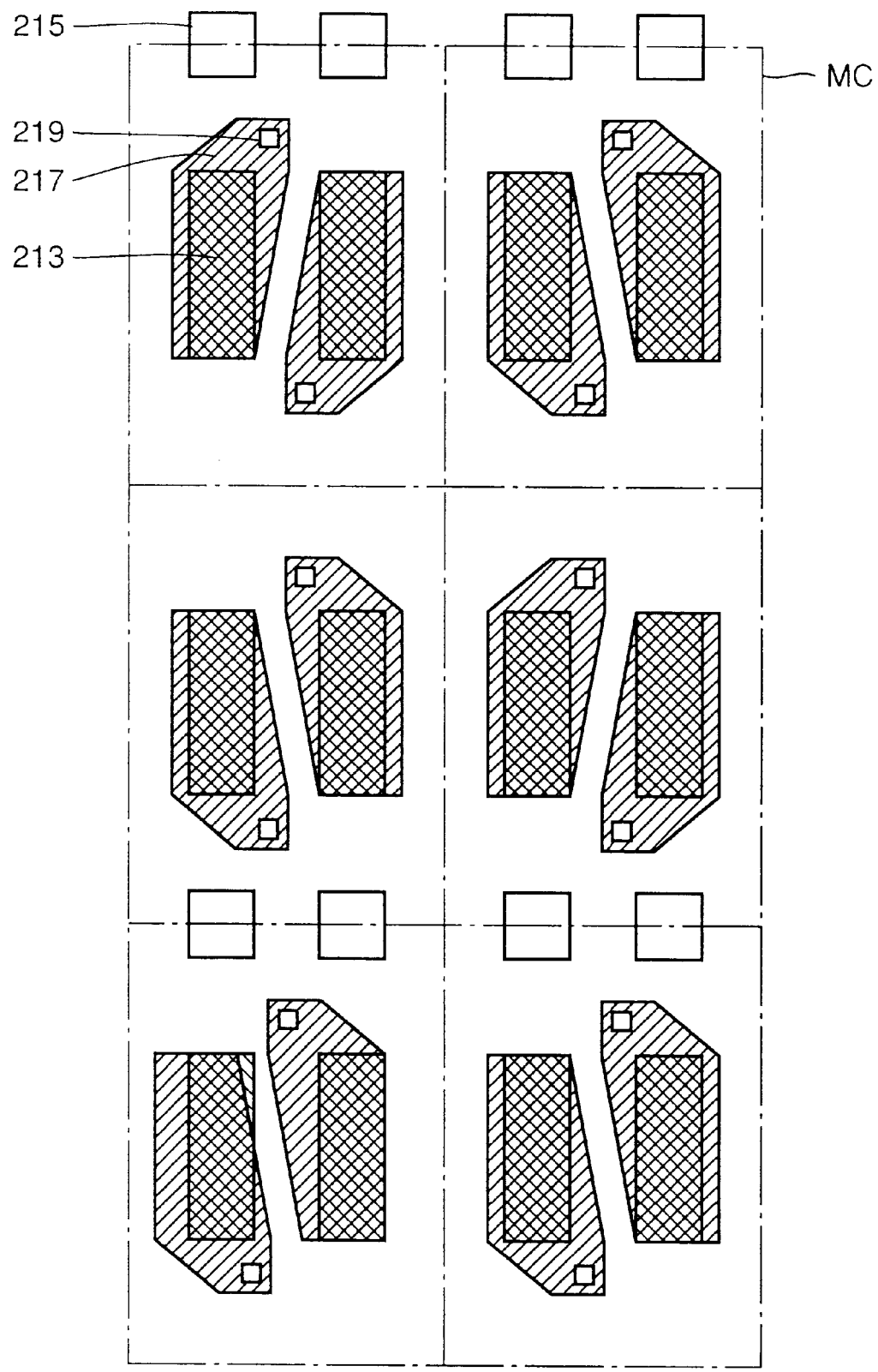
FIG. 37 is a schematic plan view showing the gate structure when TFT of a double-gate type.

Referring to FIG. 37, gate 217 forming a double gate must be provided to be opposite only to one channel region 213 of the pair of load transistors. On the contrary, the VVP layer according to the present invention may be opposite to both channel regions of the pair of load transistors. Accordingly, the patterning of the VVP layer according to the present invention is easier than the patterning of the gate of a double gate type.

In addition, gate 217 forming a double gate must be connected to driver transistor and access transistor at the lower layer within the memory cell region MC. Accordingly, a contact portion 219 for connecting gate 217 forming the double gate to other layers is required within memory cell region MC. Thus, a fine patterning is required in memory cell region MC.

On the contrary, the VVP layer according to the present invention simply needs to be opposite to the channel region of the load transistor, and thus it does not need to be connected electrically to driver transistors and access transistors. Therefore, it is not necessary to provide a contact within the memory cell for connecting the VVP layer of the present invention to other layers. Accordingly, since such contact is not needed, patterning within the memory cell region MC is made easier.

Figure 38:
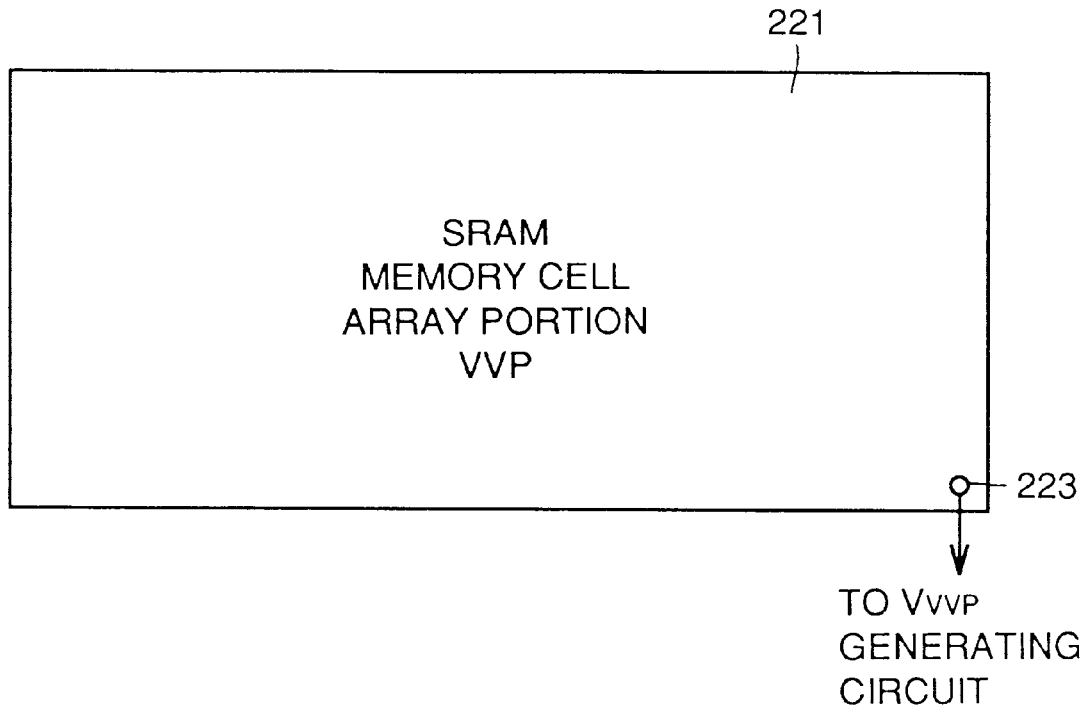
FIG. 38 is a schematic plan view showing the location of the portion where a VVP layer and a VVP voltage generating circuit are in contact when the potential of the VVP layer is assumed to be at a potential common to all cells within the SRAM chip.

Referring to FIG. 38, if VVP layer is to be set at a potential common to all the cells in the SRAM chip, it may be done by providing a single contact portion 223 which provides contact with the VVP voltage generating circuit within SRAM memory cell array 221.

Figure 39:
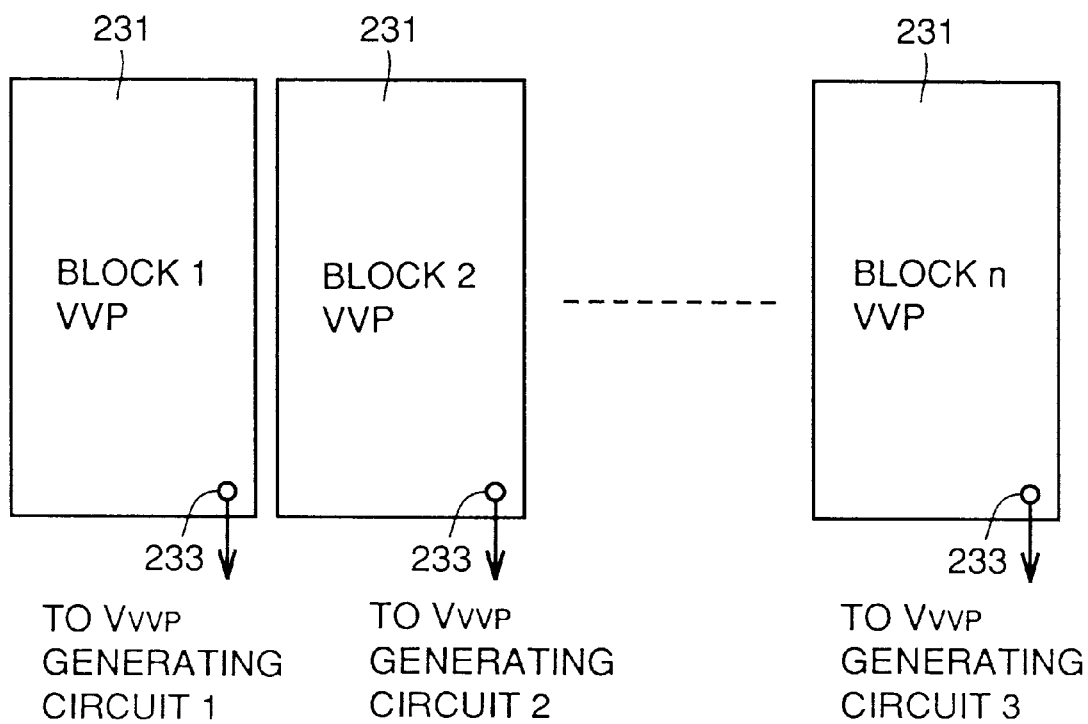
FIG. 39 is a schematic plan view showing the location of the portion where VVP layer and a VVP voltage generating circuit are in contact when the potential of the VVP layer is different from block to block.
Figure 40:
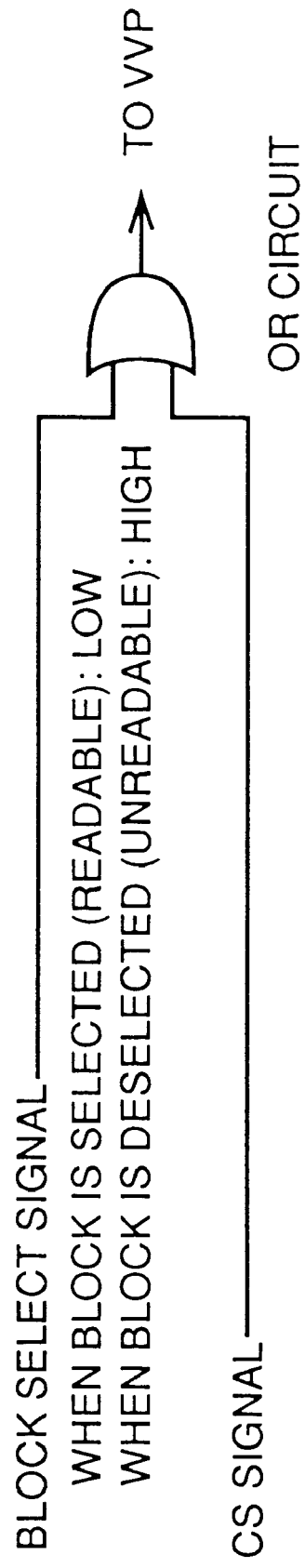
FIG. 40 shows a logic circuit employed when a signal is input to VVP voltage generating circuit of each block.

Meanwhile, referring to FIG. 39, if the potential of VVP layer is to be varied block by block, a contact portion 233 for providing contact with the VVP voltage generating circuit may be provided to every block forming the memory cell of the SRAM. In this case, VVP voltage generating circuit is required for every block 231 and the signal input to this VVP voltage generating circuit for each block may use a logic circuit as shown in FIG. 40 such that the potential would be GND when the block is selected and CS (Chips select) signal is low, while being Vcc at other times.

Figure 41:
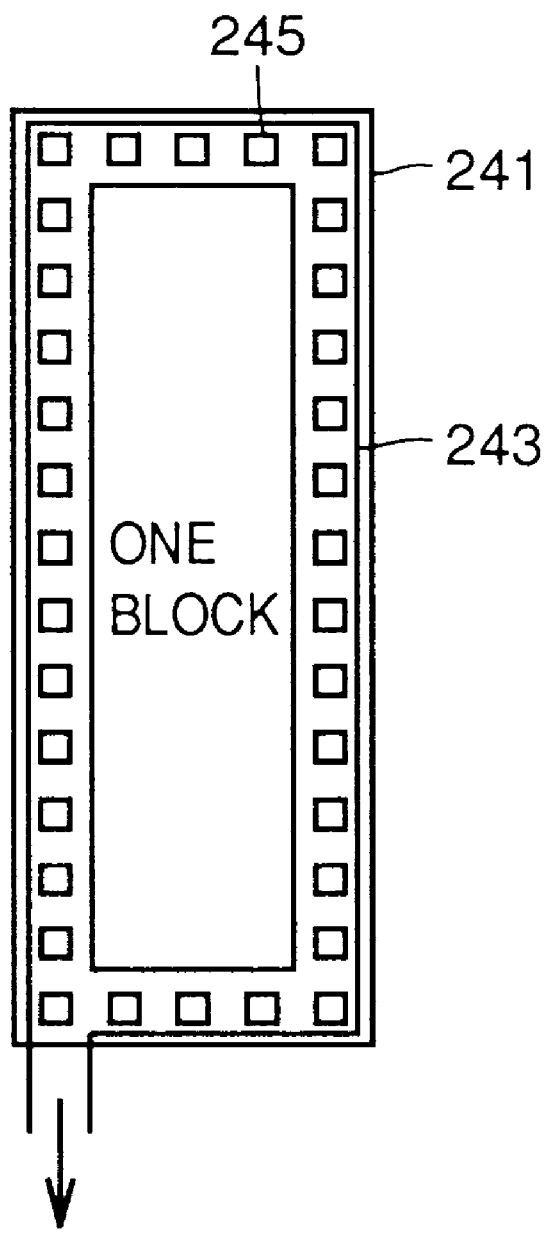
FIG. 41 is a schematic plan view of a block showing the location of a contact portion where VVP layer and VVP voltage generating circuit are in contact when the potential of VVP layer is different from block to block.

Referring to FIG. 41, when VVP layer 241 is formed of a material other than a metal material such as aluminum, many contact portions 245 may be provided in the periphery of VVP layer 241 in order to control the potential of VVP layer 241 especially accurately. Accordingly, potential from the VVP voltage generating circuit can be conducted sufficiently to VVP layer 241 via a conductive layer 243 of aluminum or the like.

Although description has been made for load transistors of offset drain structure and LDD structure in Embodiments 1 and 2, the load transistor may be of a single drain structure.

In the semiconductor memory device according to the present invention, the conductive layer is formed opposite to the rear side of the channel region with the insulating layer therebetween. In addition, the conductive layer is set at GND potential when at an active state. Accordingly, ON current of the TFT can be improved when it is active.

Meanwhile, the conductive layer is set at Vcc potential during standby. Accordingly, TFT at this standby state would show characteristics in which OFF current would be reduced when gate voltage is 0 V.

Accordingly, a large ON current can be implemented while maintaining a low OFF current of a TFT, even when the power supply voltage is made lower due to reduction in voltage.

In a preferred semiconductor memory device according to the present invention, the range of film thickness of an insulating layer is defined according to TFTs of various types. When the film thickness of the insulating layer is smaller than the lower limit of this range of film thickness, OFF current of the active TFT would be raised significantly leading to increase in power consumption. Meanwhile, when the film thickness of the insulating layer is larger than the upper limit of the range of film thickness, ON current during the active state would be lower significantly such that stable operation of the TFT cannot be obtained.

In a method of manufacturing the semiconductor memory device according to the present invention, a semiconductor memory device in which a large ON current can be implemented while maintaining a small OFF current of a TFT even when power supply voltage is made lower due to reduction in voltage can be manufactured.

In the method of using the semiconductor memory device according to the present invention, a semiconductor memory device can be operated such that a large ON current can be implemented while maintaining a small OFF current of a TFT even when power supply voltage is made lower due to reduction in voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a static type memory cell having a pair of transistors of a first conductivity type for driving, a pair of load transistors of a second conductivity type forming a flip flop circuit, and a pair of access transistors, wherein said load transistors are thin film transistors, and each comprises:
 a semiconductor layer having a pair of source/drain regions spaced apart by a distance to define a channel region; and
 a gate electrode layer provided next to said channel region of said semiconductor layer with a gate insulating layer therebetween, further comprising:
  a conductive layer provided to sandwich said channel region with said gate electrode layer and to be opposite to said channel region with an insulating layer therebetween, and adapted to be set at a Vcc potential during standby and at GND potential when active;
  said conductive layer of each of said pair of load transistors being electrically connected so as to be at equal potential and said conductive layer of each of said pair of load transistors are connected to each other to form a single layer.

2. The semiconductor memory device according to claim 1, wherein
a package incorporating a semiconductor chip having said static type memory cell and each said conductive layer has a plurality of pins including chip select pins; and
each said conductive layer is connected electrically to at least one said chip select pin with a pad electrode formed at said semiconductor chip therebetween.

3. A semiconductor memory device according to claim 2, wherein
said package is mounted on a printed circuit board;
said printed circuit board has a circuit to which Vcc potential and GND potential can be applied; and
said chip select pin of said package is connected electrically to said circuit.

4. A semiconductor memory device according to claim 1, wherein
said insulating layer has a film thickness not less than 39 nm and not more than 323 nm.

5. A semiconductor memory device according to claim 4, wherein
said source/drain regions and said channel region are of p type conductivity; and
said insulating layer has a film thickness not less than 66 nm and not more than 323 nm.

6. The semiconductor memory device according to claim 5, wherein
said insulating layer has a film thickness not less than 216 nm and not more than 323 nm when said Vcc potential is 5.0 V, said gate insulating layer has a film thickness of 30 nm, and said semiconductor layer has a film thickness of 100 nm.

7. The semiconductor memory device according to claim 5, wherein
said insulating layer has a film thickness not less than 174 nm and not more than 260 nm when said Vcc potential is 3.3 V, said gate insulating layer has a film thickness of 25 nm, and said semiconductor layer has a film thickness of 80 nm.

8. The semiconductor memory device according to claim 5, wherein
said insulating layer has a film thickness not less than 132 nm and not more than 197 nm when said Vcc potential is 2.5 V, said gate insulating layer has a film thickness of 22 nm, and said semiconductor layer has a film thickness of 50 nm.

9. The semiconductor memory device according to claim 5, wherein
said insulating layer has a film thickness not less than 98 nm and not more than 147 nm when said Vcc potential is 2.0 V, said gate insulating layer has a film thickness of 20 nm, and said semiconductor layer has a film thickness of 30 nm.

10. The semiconductor memory device according to claim 5, wherein
said insulating layer has a film thickness not less than 66 nm and not more than 99 nm when said Vcc potential is 1.5 V, said gate insulating layer has a film thickness of 15 nm, and said semiconductor layer has a film thickness of 20 nm.

11. The semiconductor memory device according to claim 4, wherein
said source/drain regions are of a p type conductivity and said channel region is of an n type conductivity;
said thin film transistor is formed such that the depth to which a depletion layer extends from the surface next to said gate electrode layer of said channel region is larger than the film thickness of said channel region when said thin film transistor is turned ON; and
said insulating layer has a film thickness not less than 39 nm and not more than 123 nm.

12. The semiconductor memory device according to claim 11, wherein
said insulating layer has a film thickness not less than 66 nm and not more than 123 nm when said Vcc potential is 5.0 V, said gate insulating layer has a film thickness of 30 nm, and said semiconductor layer has a film thickness of 100 nm.

13. The semiconductor memory device according to claim 11, wherein
said insulating layer has a film thickness not less than 55 nm and not more than 102 nm when said Vcc potential is 3.3 V, said gate insulating layer has a film thickness of 25 nm, and said semiconductor layer has a film thickness of 80 nm.

14. The semiconductor memory device according to claim 11, wherein
said insulating layer has a film thickness not less than 57 nm and not more than 97 nm when said Vcc potential is 2.5 V, said gate insulating layer has a film thickness of 22 nm, and said semiconductor layer has a film thickness of 50 nm.

15. The semiconductor memory device according to claim 11, wherein
said insulating layer has a film thickness not less than 54 nm and not more than 89 nm when said Vcc potential is 2.0 V, said gate insulating layer has a film thickness of 20 nm, and said semiconductor layer has a film thickness of 30 nm.

16. The semiconductor memory device according to claim 11, wherein
said insulating layer has a film thickness not less than 39 nm and not more than 63 nm when said Vcc potential is 1.5 V, said gate insulating layer has a film thickness of 15 nm, and said semiconductor layer has a film thickness of 20 nm.

17. The semiconductor memory device according to claim 1, wherein
said gate insulating layer and said insulating layer comprise a silicon oxide film.

18. A method of using a semiconductor memory device including a static type memory cell having a pair of transistors of a first conductivity type for driving and a pair of load transistors of a second conductivity type forming a flip flop circuit, and a pair of access transistors,
each said load transistor being formed of a thin film transistor, and comprises:
a semiconductor layer having a pair of source/drain regions spaced apart from each other by a distance to define a channel region; and
a gate electrode layer provided opposite to said channel region of said semiconductor layer with a gate insulating layer therebetween;
further including a conductive layer provided to sandwich said channel region with a said gate electrode layer and to be opposite to said channel region with an insulating layer therebetween;
said conductive layer of each of said pair of load transistors being electrically connected so as to be at equal potential and said conductive layer of each of said pair of load transistors being connected to each other to form a single layer;
said method of using said semiconductor memory device comprising the step of:
applying to said conductive layers a Vcc potential during standby and GND potential when active.

* * * * *